United States Patent [19]
Asai et al.

[11] Patent Number: 5,930,140
[45] Date of Patent: Jul. 27, 1999

[54] CIRCUIT COMPONENT SUPPLYING SYSTEM, FEEDER, AND CIRCUIT COMPONENT SUPPLYING MANAGING METHOD

[75] Inventors: Koichi Asai, Nagoya; Kunio Oe, Chiryu; Masayuki Shimmura, Anjo; Seigo Kodama, Ama-gun; Tetsunori Kawasumi, Nagoya, all of Japan

[73] Assignee: Fuji Machine Mfg. Co. Ltd., Chiryu, Japan

[21] Appl. No.: 08/942,363

[22] Filed: Oct. 2, 1997

[30] Foreign Application Priority Data

Oct. 4, 1996 [JP] Japan ..................................... 8-264757

[51] Int. Cl.⁶ ............................ G06F 17/00; G06F 19/00
[52] U.S. Cl. ............................... 364/468.28; 364/468.22; 364/478.03; 29/783; 29/809
[58] Field of Search ..................... 364/468.22, 468.28, 364/478.03, 478.13, 478.16; 29/783, 809

[56] References Cited

U.S. PATENT DOCUMENTS

| | | |
|---|---|---|
| 5,283,943 | 2/1994 | Aguayo et al. .......................... 29/701 |
| 5,325,305 | 6/1994 | Rezaei ..................................... 364/468 |
| 5,329,690 | 7/1994 | Tsuji et al. ................................ 29/701 |
| 5,671,527 | 9/1997 | Asai et al. ................................ 29/740 |
| 5,715,168 | 2/1998 | Ito ...................................... 364/478.03 |

FOREIGN PATENT DOCUMENTS

| | | |
|---|---|---|
| A-7-15179 | 1/1995 | Japan . |
| B2-7-101793 | 11/1995 | Japan . |

*Primary Examiner*—Paul P. Gordon
*Attorney, Agent, or Firm*—Oliff & Berridge, PLC

[57] ABSTRACT

A circuit component supplying system including a plurality of feeders each of which stores a plurality of circuit components of at least one sort and supplies the circuit components of the one sort, one by one, a feeder holder including a plurality of feeder holding portions which hold the plurality of feeders, respectively, and a managing device which manages the supplying of the circuit components by the each of the feeders, the each feeder including a code holder which holds at least a feeder identification code distinguishing the each feeder from the other feeders, and the managing device managing the supplying of the circuit components by the each feeder, based on the feeder identification code held by the code holder of the each feeder.

22 Claims, 22 Drawing Sheets

FIG. 13

| CC IDENTIFICATION CODE | CC ACCOMMODATING POSITION | CC ACCOMMODATING PITCH | REMAINING CC NUMBER | OTHER CC INFORMATION |
|---|---|---|---|---|
|  |  |  |  |  |
|  |  |  |  |  |
|  |  |  |  |  |
|  |  |  |  |  |
| ⋮ | ⋮ | ⋮ | ⋮ | ⋮ |

FIG. 14

| FID | CC IDENTIFICATION CODE 1 | CC IDENTIFICATION CODE 2 |
|---|---|---|
| | | |
| | | |
| | | |
| | | |
| ⋮ | ⋮ | ⋮ |

FIG. 16

| SEQUENTIAL NUMBER OF FHU | FID |
|---|---|
| 1 | |
| 2 | |
| 3 | |
| 4 | |
| ⋮ | ⋮ |

FIG. 17

| SEQUENTIAL NUMGER OF FHU | CC IDENTIFICATION CODE 1 | CC IDENTIFICATION CODE 2 |
|---|---|---|
| 1 | | |
| 2 | | |
| 3 | | |
| 4 | | |
| ⋮ | ⋮ | ⋮ |

FIG. 18

| SEQUENTAL NUMBER OF FHU | CC IDENTIFICATION CODE 1 | CC ACCOMMODATING POSITION 1 | REMAINING CC NUMBER 1 | CC IDENTIFICATION CODE 2 | CC ACCOMMODATING POSITION 2 | REMAINING CC NUMBER 2 |
|---|---|---|---|---|---|---|
| 1 | | | | | | |
| 2 | | | | | | |
| 3 | | | | | | |
| 4 | | | | | | |
| ... | ... | ... | ... | ... | ... | ... |

FIG. 19

| CC ACCOMMODATING PITCH 1 | REMAINING CC NUMBER 1 | CC ACCOMMODATING PITCH 2 | REMAINING CC NUMBER 2 |
|---|---|---|---|
|  |  |  |  |

CIRCUIT COMPONENT SUPPLYING SYSTEM, FEEDER, AND CIRCUIT COMPONENT SUPPLYING MANAGING METHOD

BACKGROUND OF THE INVENTION

1. Field of the Invention

The present invention relates to a circuit component supplying system which supplies circuit components ("CCs") to a target device such as a CC mounting device, a feeder which is suitable for the CC supplying system, and a method of managing supplying of CCs, and particularly to the art of facilitating the management of supplying of CCs or improving the reliability of the CC-supply management.

2. Related Art Statement

There is known an CC supplying system which supplies CCs to a target device such as a CC mounting device. One example of this system is disclosed in Japanese Patent Application laid open for opposition under Publication No. 7-101793. The disclosed system includes (1) a sort of CCs which are accommodated in a CC accommodating member to which an identification mark of the sort of CCs is adhered; (2) a feeder which supports the CC accommodating member in which the CCs are stored, and which supplies the CCs and has a memory for storing the number of CCs remaining therein; (3) a reader which reads the identification mark of the sort of CCs from the CC accommodating member; (4) a writing and reading device which writes data on, and reads data, from the memory of the feeder; (5) a stock data base which stores the respective identification codes of the sorts of CCs which are not in use in a current CC mounting operation, and the respective numbers of remaining CCs of those sorts, such that each identification code is related to the number of remaining CCs of a corresponding sort and such that those data can be changed; and (6) a CC-data processing device which reads, while taking into account the identification mark read by the reader, data from one of the memory of the feeder and the stock data base and writes the data on the other. When the CC-data processing device reads data from, or writes data on, the memory of the feeder, it utilizes the above writing and reading device.

This CC supplying system utilizes the stock data base for managing the respective numbers of remaining CCs of all sorts, in the following procedures. Before a CC mounting operation is started, the respective identification codes of all sorts of CCs, the respective names of all the sorts, and the respective numbers of remaining CCs of all the sorts are stored in the stock data base such that each code is related to a corresponding CC name and a corresponding remaining-CC number.

(1) A CC accommodating member in which a sort of CCs are accommodated is set on a feeder, and the identification code (i.e., bar code) adhered to the CC accommodating member is read by a reader (i.e., bar-code reader).

(2) The CC name and the remaining-CC number corresponding to the identification code read in Procedure (1) are read from the stock data base, and are written on the memory of the feeder by the writing and reading device. To this end, the feeder is equipped with a communication section which transmits data to, and receives data from, the writing and reading device.

Thus, each feeder holds the data about the sort of CCs set therein.

(3) Each feeder is set at a predetermined position in a supply section of a CC mounting device.

(4) The CC mounting device judges, according to given information, whether each feeder has been set at the predetermined position, based on the CC name stored in the memory of the feeder. The Japanese document states that if an error has been found with the setting of the feeder, the CC mounting operation is not started before an operator re-sets the feeder to the correct position.

Thus, a preparing operation before a CC mounting operation finishes. In Procedure (4), the CC mounting device reads the data from the memory of the feeder set thereon, and this reading is carried out via a communication section of the CC mounting device and the communication section of the feeder.

A CC mounting operation is carried out as follows:

(5) each time the feeder supplies one CC, the remaining-CC number stored in the memory of the feeder is decremented by one.

(6) The CC mounting device periodically monitors the remaining-CC number which is decremented one by one in Procedure (5), calculates, taking into account a time needed for mounting all CCs on each circuit substrate and a number of CCs of each sort mounted on each circuit substrate, a time when each feeder becomes empty, and controls a display device to indicate the calculated time. Based on the time displayed, an operator changes the feeder with a new one, as needed. The new feeder should be one which has been subjected to Procedures (1) and (2).

The CC mounting operation is followed by the following procedure:

(7) The data stored in the memory of each feeder are read out by the writing and reading device reads, and used for updating the data stored in the stock data base. In this way, the stock data base is utilized for managing the respective numbers of remaining CCs of all the sorts of CCs that are not in use in any CC mounting operations.

As is understood from the foregoing description, the supplying of CCs can be managed with ease and reliability, by assigning respective identification codes to different sorts of CCs. However, it is preferred that the management of supplying of CCs be much easier.

Meanwhile, in Procedure (4), the CC mounting device (strictly, the control section thereof) cannot judge whether each feeder has been set at the correct position, if it cannot identify the position on the supply section where each feeder has actually been set. However, the Japanese document does not disclose how the CC mounting device can identify the position. If the CC mounting device is equipped with a plurality of communication sections corresponding to a plurality of feeder holding portions of the supply section, respectively, and each of the communication sections is connected to the control section, independent of the other communication sections, the control section would identify one of the communication sections of the supply section which has exchanged information with the communication section of each feeder, and thereby identify the position where each feeder has been set on the supply section. However, there are some cases where it is impossible, or not desirable, that each of a plurality of communication sections be connected to a control section, independent of the other communication sections. It is a general practice to employ, for minimizing the number of wire cables, a communication network in which a plurality of communication sections are parallel connected to a control section. However, if each of a plurality of communication sections is connected to a control section, independent of the other communication sections, the above-indicated common communication network could not be employed, which would lead to increasing the production cost of the CC supplying system as a whole.

SUMMARY OF THE INVENTION

It is therefore an object of the present invention to provide a circuit component supplying system which easily manages the supplying of circuit components.

It is another object of the present invention to provide a feeder which is suitable for the above circuit component supplying system.

It is another object of the present invention to provide a method for managing easily the supplying of circuit components.

It is another object of the present invention to provide a circuit component mounting system which can easily manage the supplying of circuit components.

The present invention provides a circuit component supplying system, a feeder, a circuit component supplying managing method, and a circuit component mounting system which have one or more of the technical features which are described below in respective paragraphs given parenthesized sequential numbers (1) to (22). Any technical feature which includes another technical feature shall do so by referring, at the beginning, to the parenthesized sequential number given to that technical feature. Thus, two or more of the following features may be combined, if appropriate. Each technical feature may be accompanied by a supplemental explanation, as needed.

(1) According to a first feature of the present invention, there is provided a circuit component supplying system comprising a plurality of feeders each of which stores a plurality of circuit components of at least one sort and supplies the circuit components of the one sort, one by one; at least one feeder holder including a plurality of feeder holding portions which hold the plurality of feeders, respectively; a managing device which manages the supplying of the circuit components by the each of the feeders; the each feeder including a code holder which holds at least a feeder identification code distinguishing the each feeder from the other feeders; and the managing device managing the supplying of the circuit components by the each feeder, based on the feeder identification code held by the code holder of the each feeder. In the present circuit component ("CC") supplying system, the plurality of feeders hold the respective feeder identification codes. Each feeder identification code distinguishes a corresponding one feeder from the other feeders, irrespective of what sort of CCs are supplied by the one feeder. In contrast, if each feeder is equipped with a memory for storing a CC identification code corresponding to the sort of CCs stored in that feeder, as disclosed in the previously identified Japanese patent document, that feeder can be identified based on the CC identification code, so long as the sort of CCs are stored in that feeder. Therefore, if the sort of CCs are removed from that feeder, that feeder cannot be identified any longer. For managing the supplying of CCs, it is desirable to be able to identify each feeder independent of what sort of CCs are stored in that feeder or independent of the CC identification code corresponding to the sort of CCs stored in that feeder. For example, information about any errors with the CC supplying operation of each feeder, and/or information about maintenance of each feeder can be easily managed. In the case where it does not matter with a characteristic of a group of feeders of each sort, each production lot, or each production date, but does matter with that of each individual feeder, it is essentially required that each individual feeder be identified from the other feeders. Another reason for the convenience of use of feeder identification codes is that the supplying of CCs can be managed depending upon the feeders. As disclosed in the above Japanese patent document, it is convenient to use the CC identification codes, for managing the supplying of CCs, e.g., managing the stock or inventory CCs. However, there are some cases where it is more convenient to use the feeder identification codes for managing the supplying of CCs. For example, the managing device can indirectly identify the sort of the CCs supplied by each feeder, by identifying that feeder based on the feeder identification code of that feeder. In addition, in the case where all the feeders that may possibly be used in a factory have their own feeder identification codes, the present CC supplying system can easily manage the supplying of each sort of CCs, by collecting and storing information about the current state of that sort of CCs.

(2) According to a second feature of the present invention which includes the first feature (1), the each feeder comprises a feeder-side controller, and wherein the managing device comprises a holder-side controller provided on the side of the feeder holder; a first communication network with which the respective feeder-side controllers of the feeders which are held by the feeder holding portions, respectively, are parallel connected to the holder-side controller; a second communication network with which each of the respective feeder-side controllers are connected to the holder-side controller, independent of the other feeder-side controllers; and an identification-control device which causes one of the each feeder-side controller and the holder-side controller to send, to the first communication network, a first signal including the feeder identification code of the feeder having the each feeder-side controller, causes one of the each feeder-side controller and the holder-side controller to send a second signal to the second communication network, so that the other controller receives the second signal, and identifies one of the feeder holding portions which holds the feeder having the each feeder-side controller, from the other feeder holding portions. In the present CC supplying system, the feeder-side controller of each feeder can exchange information with the holder-side controller of the feeder holder via the first communication network. If one feeder is held by the feeder holder, the feeder-side controller of the feeder is parallel connected to the holder-side controller via the first communication network. Thus, any signal on the first communication network can be simultaneously received by the holder-side controller and the respective feeder-side controllers of all the feeders held by the feeder holder. The first communication network may be provided by a simple structure such as a pair of twisted lines which terminate with a resistor at each of opposite ends thereof, or a single coaxial cable. In those cases, the managing device enjoys a simple construction. There are known various communication methods in each of which a signal receiver as a controller connected to the communication network of this type can identify a signal transmitter as another controller connected to the same when the receiver receives a signal from the transmitter via the communication network and in which a plurality of signal transmitters as controllers connected to the communication network are prevented from simultaneously transmitting their signals to the network. In many cases, the CSMA/CD method, the token-passing method, the polling method, or the like is employed. In the case where the communication network of this type or the communication method of this sort is employed, generally, each controller connected to the network has its address information. The above-indicated feeder identification code of each feeder can be used as the address information of the feeder-side controller of that feeder. However, with the first communication network only, the managing device cannot identify one of the feeder holding portions which holds a feeder in question, from the other feeder holding portions, that is, the position of that feeder holding portion relative to the others. Hence, the managing device of the present CC supplying system additionally includes the second communication network. With the second network, each of the respective feeder-side controllers of the feeders is connected to the holder-side controller, independent of the other feeder-side controllers. That is, the holder-side controller can transmit a signal to, and receive a signal from, each feeder-side controller via the second network, while identifying one of the feeder holding portions which currently holds the feeder having that feeder-side controller. By carrying out communication (i.e., transmission and reception of signal) using the first and second networks, the identification-control device can identify the feeder holding portion holding the feeder holding the feeder identification code in question. To this end, any one of the following optional procedures (1) to (4) may be employed:

Procedure (1)

First, each feeder sends its feeder identification code to the first network, and the holder-side controller receives the respective feeder identification codes of the feeders. Second, the holder-side controller sends, to the first network, a command including the feeder identification code sent from each feeder. The command commands sending a signal to the second network. All the feeders receives this command from the first network. Third, the feeder-side controller of each feeder compares the feeder identification code included in the received command with that of its own and, if they are identical with each other, sends the signal to the second network. Fourth, the holder-side controller identifies one of the feeder holding portions which holds the feeder having the feeder-side controller which has sent the signal to the second network.

Procedure (2)

First, each feeder sends its feeder identification code to the first network, and the holder-side controller receives the respective feeder identification codes of the feeders. Second, the holder-side controller sends, to the first network, a command which is directed to all the feeder-side controllers and which commands each feeder-side controller to send, if it receives a signal from the second network, a signal which indicates that it has received the signal via the second network and which includes the feeder identification code of the feeder having it, to the first network. Third, the holder-side controller sequentially sends a signal to each of respective lines of the second network which correspond to the respective feeder holding portions, and receives a signal from each feeder-side controller in response thereto via the first network. Based on the signal received from each feeder-side controller, and the respective positions of the feeder holding portions, the identification-control device can identify the position of the feeder holding portion holding the feeder having that feeder-side controller.

Procedure (3)

First, the holder-side controller sequentially sends, to the first network, a feeder identification code of each of the feeders which may possibly be held by the feeder holder. All the feeder-side controllers receive the respective feeder identification codes of those feeders via the first network. Second, if the received feeder identification code is identical with that of its own, each feeder-side controller sends a signal to the second network. Third, if the holder-side controller receives a signal via the second network, it can identify the feeder holding portion holding the feeder corresponding to the feeder identification code which has been sent thereby to the first network immediately before the reception of the signal from the second network.

Procedure (4)

First, the holder-side controller sequentially sends a signal to each of respective lines of the second network which correspond to the respective feeder holding portions. Second, if each of the respective feeder-side controllers of the feeders held by the respective feeder holding portions receives the signal via the second network, it sends its own feeder identification code to the first network. Third, if the holder-side controller finds the feeder identification code on the first network, it can identify the feeder holding portion holding the feeder having the feeder-side controller which has received the signal via the second network immediately before the finding of the feeder identification code on the first network.

However, the procedure in which the identification-control device can identify each feeder holding portion using the first and second communication networks, is not limited to the above described four procedures (1) to (4), but may comprise one or more different procedures. The present CC supplying system may employ any one of those procedures. As is apparent from the above description, in the present CC supplying system, the first communication network in which the plurality of feeder-side controllers are parallel connected to the holder-side controller is employed for performing common information exchange. Accordingly, a common communication network may be employed as the first network. Additionally, the present system employs the second communication network for performing simple communication, and the feeder identification codes. With the first and second networks and the feeder identification codes, the present system can identify which one of the feeder holding portions of the feeder holder holds each of the feeders. Therefore, if an operator sets one or more feeders on incorrect feeder holding portions of the feeder holder, the present system may operate a display to inform the operator of those errors while identifying or designating one or more feeder holding portions holding the incorrect feeders. Thus, the operator can easily correct the errors. In the case where the CC supplying operation is carried out according to a control program which has been produced using not the positions of the feeder holding portions but the feeder identification codes, it can be carried out without needing correction of the control program, even if the operator may have set one or more feeders on incorrect feeder holding portions.

(3) According to a third feature of the present invention which includes the second feature (2), the managing device further comprises a component-feeder memory which stores information including the respective feeder identification codes of the feeders and respective component identification codes corresponding to a plurality of sorts of circuit components, respectively, such that the feeder identification code of the each feeder is related to the component identification code corresponding to the one sort of the circuit components stored in the each feeder; and component-sort identifying means for identifying the sort of the circuit components corresponding to the one feeder holding portion identified by the identification-control device, based on the information stored in the component-feeder memory and the feeder identification code of the feeder held by the one feeder holding portion. In the present CC supplying system, the component-sort identifying means identifies the feeder holding portion holding the feeder storing the CCs of each sort, based on the following two relationships: the first one is the correspondence relationship between the position of the feeder holding portion identified by the identification-control device and the feeder identification code of the feeder held by that feeder holding portion, and the second one is the correspondence relationship between the component identification code and the feeder identification code. The second relationship is stored in advance in the component-feeder memory. For example, when a sort of CCs are stored in each feeder, a bar code representing a component identification code of the sort of CCs is read by a bar-code reader, and simultaneously a bar code representing a feeder identification code of that feeder is read out by a reading and writing device, so that the two identification codes are stored in relation with each other in the component-feeder memory. The component-sort identifying means indirectly identifies the sort of the CCs corresponding to the feeder holding portion, by means of the feeder identification code. The above two identification codes may be related to each other, in advance, before the feeder is held by the feeder holder. A bar code representing a feeder-holding-portion identification code may be adhered to each of the feeder holding portions of the feeder holder. In this case, when each feeder is set on the feeder holder, the bar code adhered to the feeder holding portion which holds that feeder may be read by a bar-code reader, so that the feeder-holding-portion identification code may be related to the feeder identification code of that feeder. However, in this case, the operator must set the feeders on the feeder holder while relating the feeders to the feeder holding portions, respectively, which leads to lowering the degree of freedom of the preparing operation before the CC mounting operation. The present CC mounting system is free from this problem.

(4) According to a fourth feature of the present invention which includes the second or third feature (2) or (3), the identification-control device comprises feeder-identification-code sending means provided in the feeder-side controller of the each feeder, for sending, as the first signal, the feeder identification code of the each feeder, to the first communication network; response causing means provided in the holder-side controller, for causing sending, to the first communication network, a response command including the feeder identification code sent from the feeder-identification-code sending means, the response command causing the feeder-side controller of the each feeder corresponding to the feeder identification code included in the response command, to send, as the second signal, a response signal to the second communication network; responding means provided in the feeder-side controller of the each feeder, for sending the response signal to the second communication network, in response to the response command; and feeder-holding-portion identifying means provided in the holder-side controller, for identifying, based on the response signal, the one of the feeder holding portions which holds the each feeder corresponding to the feeder identification code included in the response command.

(5) According to a fifth feature of the present invention which includes the fourth feature (4), the circuit component supplying system further comprises an electric-power supplying device which is provided on the side of the feeder holder and which supplies an electric power to the each feeder which is held by the feeder holder, and wherein the feeder-identification-code sending means of the each feeder sends the feeder identification code of the each feeder to the first communication network, in response to commencement of the supplying of the electric power from the electric-power supplying device to the each feeder.

(6) According to a sixth feature of the present invention which includes the second or third feature (2) or (3), the identification-control device comprises response causing means provided in the holder-side controller, for causing sequentially sending, to the first communication network, a plurality of response commands as the first signals which include the feeder identification codes of the feeders, respectively, which may possibly be held by the feeder holder, each of the response commands causing the feeder-side controller of the feeder corresponding to the feeder identification code included in the each response command, to send, as the second signal, a response signal to the second communication network; responding means provided in the feeder-side controller of the each feeder, for sending the response signal to the second communication network, in response to the each response command, when the feeder identification code included in the each response command is identical with the feeder identification code of the each feeder; and feeder-holding-portion identifying means provided in the holder-side controller, for identifying, based on the response signal, the one of the feeder holding portions which holds the feeder corresponding to the feeder identification code included in the each response command.

(7) According to a seventh feature of the present invention, there is provided a circuit component supplying system comprising a plurality of feeders each of which stores a plurality of circuit components of at least one sort and supplies the circuit components of the one sort, one by one, the each feeder including a feeder-side connection portion; the each feeder further including a feeder-side controller which is connected to the feeder-side connection portion; a feeder holder including a plurality of feeder holding portions which hold the plurality of feeders, respectively; a communication network including a plurality of holder-side connection portions which are provided on the side of the feeder holder and which correspond to the feeder-side connection portions of the feeders, respectively, and are parallel connected to a remaining portion of the communication network, the communication network communicating a first signal with the feeder-side controller of the each feeder via the feeder-side connection portion of the each feeder and a corresponding one of the holder-side connection portions, without identifying the one holder-side connection portion from the other holder-side connection portions; a feeder-holding-portion identifying device which identifies one of the feeder holding portions which holds the each feeder, from the other feeder holding portions; and a holder-side controller which is provided on the side of the feeder holder and is connected to the communication network. In the present CC supplying system, each of the plurality of feeders includes a feeder-side controller and a feeder-side connection portion, and the holder-side controller and the plurality of holder-side connection portions which correspond to the feeder holding portions of the feeder holder, respectively, are provided on the side of the feeder holder. The holder-side connection portions are parallel connected to the holder-side controller. The communication network including the plurality of holder-side connection portions which are parallel connected to the holder-side controller, cannot identify one of the holder-side connection portions which is used for the current communication (i.e., information exchange) between the holder-side controller and the feeder-side controller of each feeder. Accordingly, the network cannot identify which one of the feeder holding portions holds each holder. However, the network can enable the communication between the holder-side controller and the feeder-side controller of each feeder. Since the feeder-holding-portion identifying device can identify which one of the feeder holding portions holds each holder, the holder-side controller can know the feeder holding portion holding the feeder having the feeder-side controller with which the holder-side controller currently communicates via the communication network. Thus, the communication network can enjoy a simple construction, like the first communication network employed in the CC supplying system in accordance with the above-described second feature (2), which contributes to simplifying the overall construction of the present CC supplying system.

(8) According to an eighth feature of the present invention which includes the seventh feature (7), the feeder-holding-portion identifying device comprises a plurality of second feeder-side connection portions each of which is provided on a corresponding one of the feeders, as being different from the feeder-side connection portion of the one feeder as a first feeder-side connection portion thereof, and is connected to the feeder-side controller of the one feeder; a plurality of second holder-side connection portions which correspond to the second feeder-side connection portions of the feeders, respectively, and each of which is provided on a corresponding one of the feeder holding portions, as being different from the holder-side connection portion of the one feeder holding portion as a first holder-side connection portion thereof, and is connected to the holder-side controller, independent of the other second holder-side connection portions; and an identification-control device which causes one of the second feeder-side connection portion of the each feeder and a corresponding one of the second holder-side connection portions, to send a second signal to the other connection portion, causes the other connection portion to receive the second signal, and identifies the one feeder holding portion holding the each feeder. In the present CC supplying system, the identification-control device identifies one of the feeder holding portions holds each feeder, based on the second signal which is communicated between the second feeder-side connection portion of the each feeder and the second holder-side connection portion of that one feeder holding portion. In the case where the second feeder-side connection portion of each feeder sends the second signal, the second signal is received by the second holder-side connection portion of the feeder holding portion holding that each feeder. Since each of the respective holder-side connection portions of the feeder holding portions is connected to the holder-side controller, independent of the other holder-side connection portions, the holder-side controller can identify the feeder holding portion holding the feeder which has sent the second signal. Since this procedure is repeatedly carried out for all the second holder-side connection portions, the holder-side controller can identify each of the feeder holding portions holding the feeders each of which has sent the second signal. Alternatively, the second holder-side connection portions may send the second signals. In this case, when each one of the second holder-side connection portions sends the second signal, all the other second holder-side connection portions are inhibited from doing so. The second signal sent by that each second holder-side connection portion is received by the second feeder-side connection portion of the feeder which is held by the feeder holding portion having that each second holder-side connection portion. The feeder-side controller of that feeder sends data to the holder-side controller via the communication network, in response to the reception of the second signal via the second feeder-side connection portion of that feeder. Therefore, when the holder-side controller receives the data via the communication network, the controller can identify the feeder holding portion holding the feeder whose feeder-side controller has sent the data thereto. In either case, each of the second holder-side connection portions is connected to the holder-side controller, independent of the other second holder-side connection portions. The second signal may be a simple signal, such as a single pulse signal. Thus, the communication (i.e., sending and reception) of the second signal can be easily controlled. Therefore, even if a common communication network available on the market may not be employed as the communication network of the present system, the production cost of the present system may not be increased so much.

(9) According to a ninth feature of the present invention which includes the seventh feature (7), the feeder-holding-portion identifying device comprises a feeder-identification-code memory which is provided on said each feeder and which stores a feeder identification code corresponding to said each feeder in a state in which the feeder identification code is readable therefrom; a feeder-holding-portion identification-code memory which corresponds to each of the feeder holding portions and which stores a feeder-holding-portion identification code corresponding to said each feeder holding portion in a state in which the feeder-holding-portion identification code is readable therefrom; and identification-code relating means provided on one of said each feeder and the feeder holder, for reading the feeder identification code of said each feeder and the feeder-holding-portion identification code of said each feeder holding portion and relating the two identification codes to each other.

(10) According to a tenth feature of the present invention which includes the seventh feature (7), the feeder-holding-portion identifying device comprises a plurality of identification things each of which distinguishes a corresponding one of the feeder holding portions from the other feeder holding portions; and an identification-thing identifying device which is provided on the each feeder and which identifies the identification thing of the one feeder holding portion from the respective identification things of the other feeder holding portions. In the present CC supplying system, each feeder has its identification-thing identifying device which can identify the identification thing of each of the feeder holding portions, and accordingly each feeder can identify which one of the feeder holding portions is holding itself. Therefore, the holder-side controller can know the feeder holding portion holding each feeder, based on the data communicated with the feeder-side controller of that each feeder via the communication network. The identification thing which distinguishes each feeder holding portion from the other feeder holding portions, may be a mark or pattern, such as a bar code, a Maxi code, or a Calla code, which can be recognized by a one-dimensional or two-dimensional pattern recognizing system provided on each feeder; an identification (ID) chip which can be recognized by electromagnetic connection (which may be optical connection) between each feeder connection portion and each feeder; or a plurality of connecting members which have different dimensions or shapes and which can be mechanically connected with a connection recognizing device (e.g., electric switches) provided on each feeder so that the dimension or shape of the connection member provided on each feeder holding portion may be recognized by the connection recognizing device of each feeder.

(11) According to an eleventh feature of the present invention which includes the tenth feature (10), the identification-thing identifying device comprises a no-contact-type identifying device which identifies the identification thing of the each feeder holding portion without mechanically contacting the identification thing.

(12) According to a twelfth feature of the present invention which includes the tenth feature (10), the identification-thing identifying device comprises a contact-type identifying device which identifies the identification thing of the each feeder holding portion by mechanically contacting the identification thing.

(13) According to a thirteenth feature of the present invention, there is provided a feeder for storing a plurality of circuit components of at least one sort and supplying the circuit components of the one sort, one by one, the improvements comprising an identification code memory which stores a feeder identification code distinguishing the feeder from other feeders, in a state in which the feeder identification code is readable therefrom. The present feeder has the identification code memory which stores the own feeder identification code distinguishing the feeder from other feeders, in a state in which the feeder identification code is readable therefrom. Therefore, the feeder identification code can be read out of the memory by an identification-code reading means, which may be provided on the feeder or each of the feeder holding portions of the feeder holder as described above. For example, in the case where the feeder is equipped with the feeder-side controller as described above, the identification-code reading means may be provided by the feeder-side controller. The feeder identification read out by the identification-code reading means of the feeder-side controller may then be read out by an external device such as the above-described holder-side controller of the feeder holder. However, it is not essentially required that the feeder identification read out from the memory can be read out by an external device. In addition, it is not essentially required that each feeder be equipped with the feeder-side controller. In the last case, the feeder identification may be read out from the memory directly by an external device. Anyhow, the present feeder can be advantageously employed in the CC supplying system in accordance with the first feature (1).

(14) According to a fourteenth feature of the present invention which includes the thirteenth feature (13), the feeder further comprises identification-code reading means for reading the feeder identification code from the identification code memory.

(15) According to a fifteenth feature of the present invention which includes the thirteenth or fourteenth feature (13) or (14), the feeder further comprises a feeder-side connection portion which is connectable to one of respective holder-side connection portions of a plurality of feeder holding portions of a feeder holder, such that the feeder-side connection portion can transmit a signal to the one holder-side connection portion.

(16) According to a sixteenth feature of the present invention which includes the fifteenth feature (15), the feeder further comprises an identification-code transmitter which transmits the feeder identification code read by the identification-code reading means to the one holder-side connection portion via the feeder-side connection portion.

(17) According to a seventeenth feature of the present invention, there is provided a method of managing the supplying of circuit components by a circuit component supplying system including a plurality of feeders each of which stores a plurality of circuit components of at least one sort and supplies the circuit components of the one sort, one by one, comprising the steps of assigning a plurality of feeder identification codes to the feeders, respectively, and managing the supplying of the circuit components by the circuit component supplying system, based on the feeder identification codes. The present method facilitates the management of supplying of CCs, for example, when it is applied to the CC supplying system in accordance with any one of the first to ninth features (1) to (9).

(18) According to an eighteenth feature of the present invention which includes the seventeenth feature (17), the method further comprises the steps of relating the feeder identification code of each of the feeders to a component identification code corresponding to the one sort of the circuit components stored in the each feeder, relating the feeder identification code of the each feeder to one of a plurality of feeder holding portions of a feeder holder of the circuit component supplying system which hold the feeders, respectively, the one feeder holding portion holding the each feeder, and identifying the sort of the circuit components corresponding to the one feeder holding portion. In the present CC-supply managing method, each feeder holding portion is related to the feeder identification code of the feeder which is held by that each feeder holding portion. Thus, one of the feeder holding portions which holds each feeder can be identified from the other feeder holding portions. In addition, one of the feeders which feeds or supplies each sort of CCs can be identified from the other feeders, by relating the component identification code of that each sort of CCs to the feeder identification code of the feeder storing that each sort of CCs. Thus, one of the feeder holding portions which holds the feeder storing each sort of CCs can be identified from the other feeder holding portions, by using the feeder identification code of that feeder as a key or a mediator. According to the present CC-supply managing method, one of the feeder holding portions which holds the feeder storing each sort of CCs can be identified from the other feeder holding portions, even though the feeder storing the each sort of CCs may be held by any one of the feeder holding portions. Thus, in the present CC-supply managing method, like in the CC supplying system in accordance with the second feature (2), an operator can easily correct (i.e., remove and reset) one or more feeders which have erroneously been set by him or her on feeder holding portions and, additionally, if a CC-supply control program which is based on not the positions of the feeder holding portions but the sorts of the CCs, the operator need not do any correcting work even if he or she makes some errors the feeder setting operation.

(19) According to a nineteenth feature of the present invention, there is provided a circuit component mounting system comprising a circuit component supplying system according to the first feature (1), the circuit component supplying system comprising a plurality of the feeder holders; a circuit component mounting apparatus which mounts, on a circuit substrate, the circuit components supplied from the supplying system; the mounting apparatus comprising a plurality of combining positions where the plurality of feeder holders are combinable with the mounting apparatus, respectively; and the managing device of the supplying system comprising a mounting-apparatus-side controller which is provided on the side of the mounting apparatus, a plurality of holder-side controllers each of which is provided on a corresponding one of the feeder holders which are combined at the respective combining positions with the mounting apparatus, a first communication network with which the holder-side controllers are parallel connected to the mounting-apparatus-side controller, a second communication network with which each of the holder-side controllers is connected to the mounting-apparatus-side controller, independent of the other holder-side controllers, and an identification-control device which causes one of the each holder-side controller and the mounting-apparatus-side controller to send, to the first communication network, a first signal including a holder identification code corresponding to the feeder holder having the each holder-side controller, causes one of the each holder-side controller and the mounting-apparatus-side controller to send a second signal to the second communication network, so that the other controller receives the second signal, and identifies one of the combining positions where the feeder holder having the each holder-side controller is combined with the mounting apparatus.

(20) According to a twentieth feature of the present invention which includes the nineteenth feature (19), the identification-control device comprises holder-identification-code sending means provided in the holder-side controller of each of the feeder holders, for sending, as the first signal, the holder identification code of the each feeder holder, to the first communication network; response causing means provided in the mounting-apparatus-side controller, for causing sending, to the first communication network, a response command including the holder identification code sent from the holder-identification-code sending means, the response command causing the holder-side controller of the each feeder holder corresponding to the holder identification code included in the response command, to send a response signal to the second communication network; responding means provided in the holder-side controller of the each feeder holder, for sending the response signal to the second communication network, in response to the response command; and feeder-holding-portion identifying means provided in the mounting-apparatus-side controller, for identifying, based on the response signal, one of the combining positions where the each feeder holder corresponding to the holder identification code included in the response command is combined with the mounting apparatus.

(21) According to a twenty-first feature of the present invention which includes the twentieth feature (20), the circuit component mounting system further comprises an electric-power supplying device which is provided on the side of the mounting apparatus and which supplies an electric power to the each feeder holder which is combined with the mounting apparatus, and wherein the holder-identification-code outputting means sends the holder identification code of the each feeder holder to the first communication network, in response to commencement of the supplying of the electric power from the electric-power supplying device to the each feeder holder.

(22) According to a twenty-second feature of the present invention which includes the nineteenth feature (19), the identification-control device comprises response causing means provided in the mounting-apparatus-side controller, for causing sequentially sending, to the first communication network, a plurality of response commands as the first signals which include the holder identification codes of the feeder holders, respectively, which may possibly be combined with the mounting apparatus, each of the response commands causing the holder-side controller of the feeder holder corresponding to the holder identification code included in the each response command, to send a response signal to the second communication network; responding means provided in the holder-side controller of each of the feeder holders, for sending, as the second signal, the response signal to the second communication network, in response to the each response command, when the holder identification code included in the each response command is identical with the holder identification code of the each feeder holder; and combining-position identifying means provided in the mounting-apparatus-side controller, for identifying, based on the response signal, the one of the combining positions where the feeder holder corresponding to the holder identification code included in the each response command is combined with the mounting apparatus.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which:

FIG. 13 is a table showing a CC data base which is stored in a host computer of the CC mounting system of FIG. 1;

FIG. 14 is a CC-feeder table which is stored in a laptop ("LT") computer of the CC mounting system of FIG. 1 and which is transmitted to a SFU controller of the CC supplying apparatus of FIG. 1;

FIG. 16 is a feeder-FHU table which is prepared by the SFU controller;

FIG. 17 is a CC-FHU table which is prepared by the SFU controller based on the CC-feeder table and the feeder-FHU table and which is transmitted to the M/C controller;

FIG. 18 is a CC-CC remaining number table which is prepared by the M/C controller based on the CC-FHU table and the CC data base and which is transmitted to the SFU controller;

FIG. 19 is a CC accommodating pitch-CC remaining number table which is stored in an F/D controller of the feeder of FIG. 5;

DETAILED DESCRIPTION OF THE PREFERRED EMBODIMENTS

Referring first to FIGS. 1–19, there will be described a circuit-component ("CC") mounting system 500 (FIG. 8) including a CC mounting apparatus 10 which mounts CCs on a circuit substrate such as a printed circuit board ("PCB"), and a CC supplying system 50 to which the present invention is applied.

Figure 1:
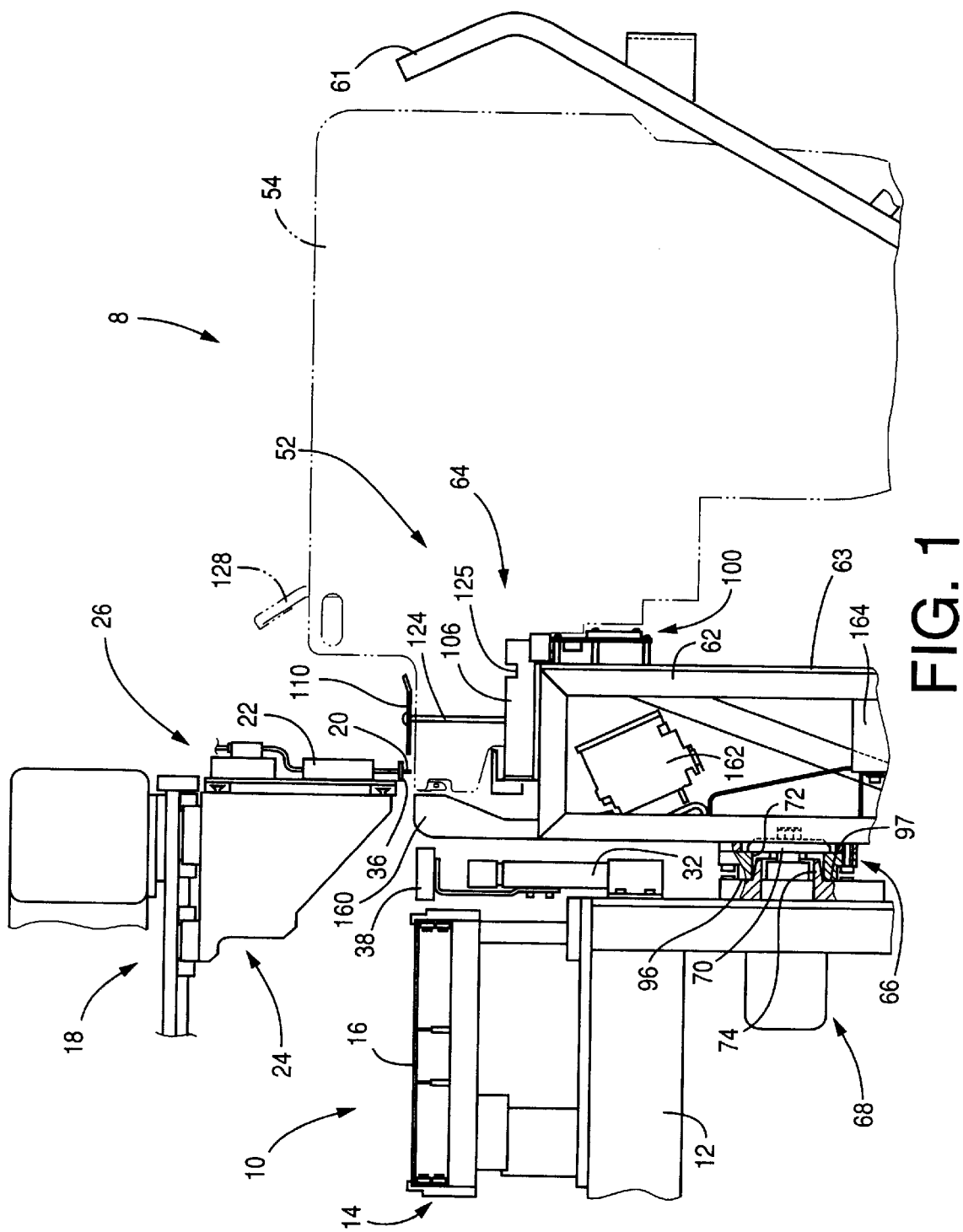
FIG. 1 is a front elevation view of a portion of a circuit component ("CC") mounting system which includes a CC mounting apparatus, and a CC supplying system including a CC supplying apparatus, and which embodies the present invention.

In FIG. 1, reference numeral 8 designates a CC supplying apparatus of the CC supplying system 50, and the CC mounting apparatus 10 mounts, on the PCBs, the CCs supplied from the CC supplying apparatus 8. FIG. 1 shows a combined state in which the two apparatus 8, 10 are combined with each other.

The CC mounting apparatus 10 includes a mounting machine 18 which mounts CCs on a PCB 16 which is fed by a PCB feeding device 14, provided on a base frame 12, and is positioned and held at a pre-determined position. The mounting machine 18 includes a suction nozzle 20 which sucks a CC with a negative air pressure, a Z-θ moving device 22 which moves the suction nozzle 20 up and down in a vertical direction (hereinafter, referred to as the "Z" direction) and moves or rotates the nozzle 20 in a direction about a vertical axis (hereinafter, referred to as the "θ" direction), and an X-Y moving device 24 which supports and moves the Z-θ moving device 22 in a PCB feeding direction in which the PCB 16 is fed by the PCB feeding device 14 (in a direction normal to the plane of the sheet of FIG. 1; hereinafter, referred to as the "X" direction) and in a horizontal direction normal to the X direction (hereinafter, referred to as the "Y" direction). The Z-θ moving device 22 and the X-Y moving device 24 cooperate with each other to provide an X-Y-Z-θ moving device 26.

Figure 8:
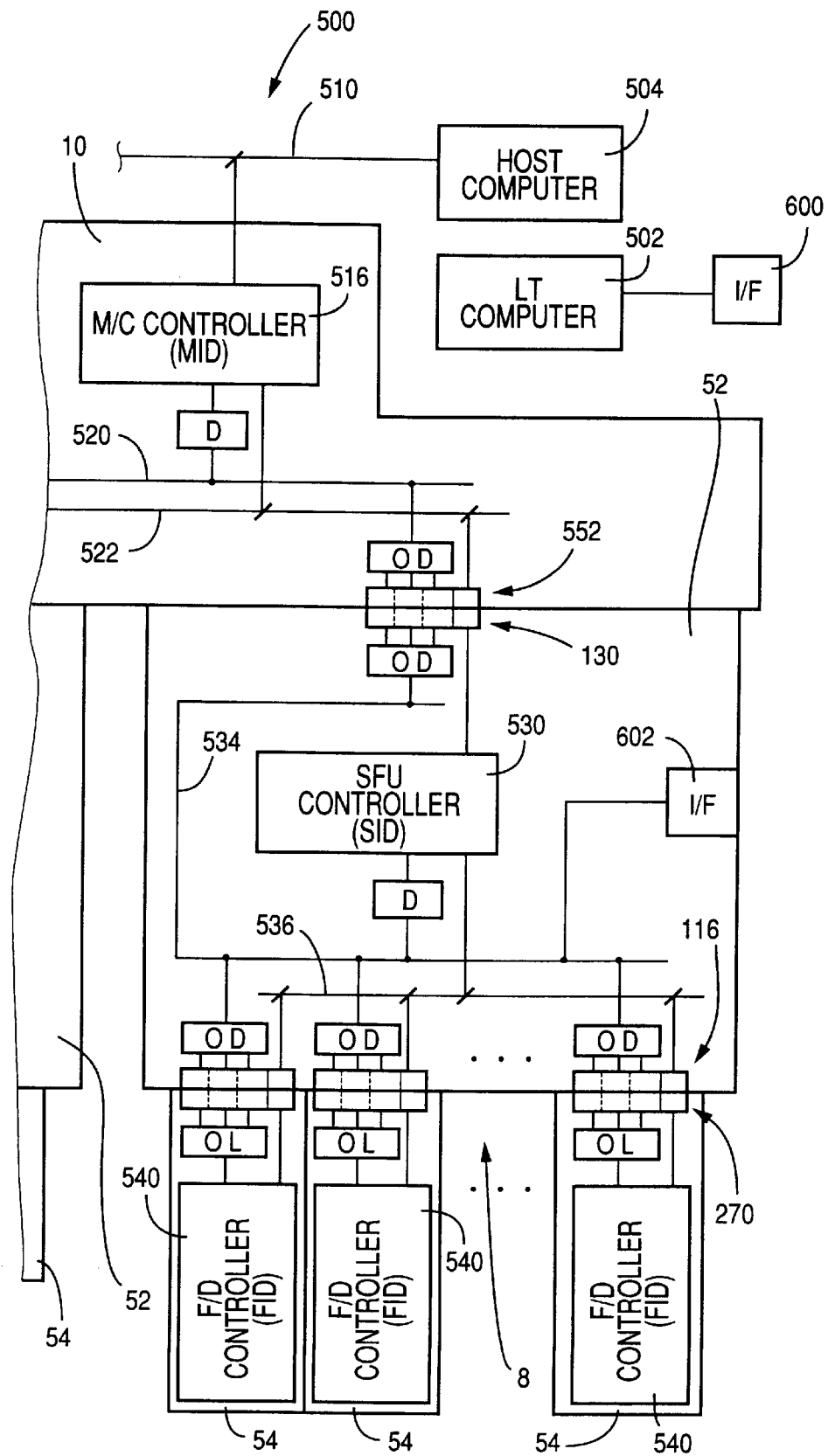
FIG. 8 is a view of an electric system of the CC mounting system of FIG. 1.
Figure 9:
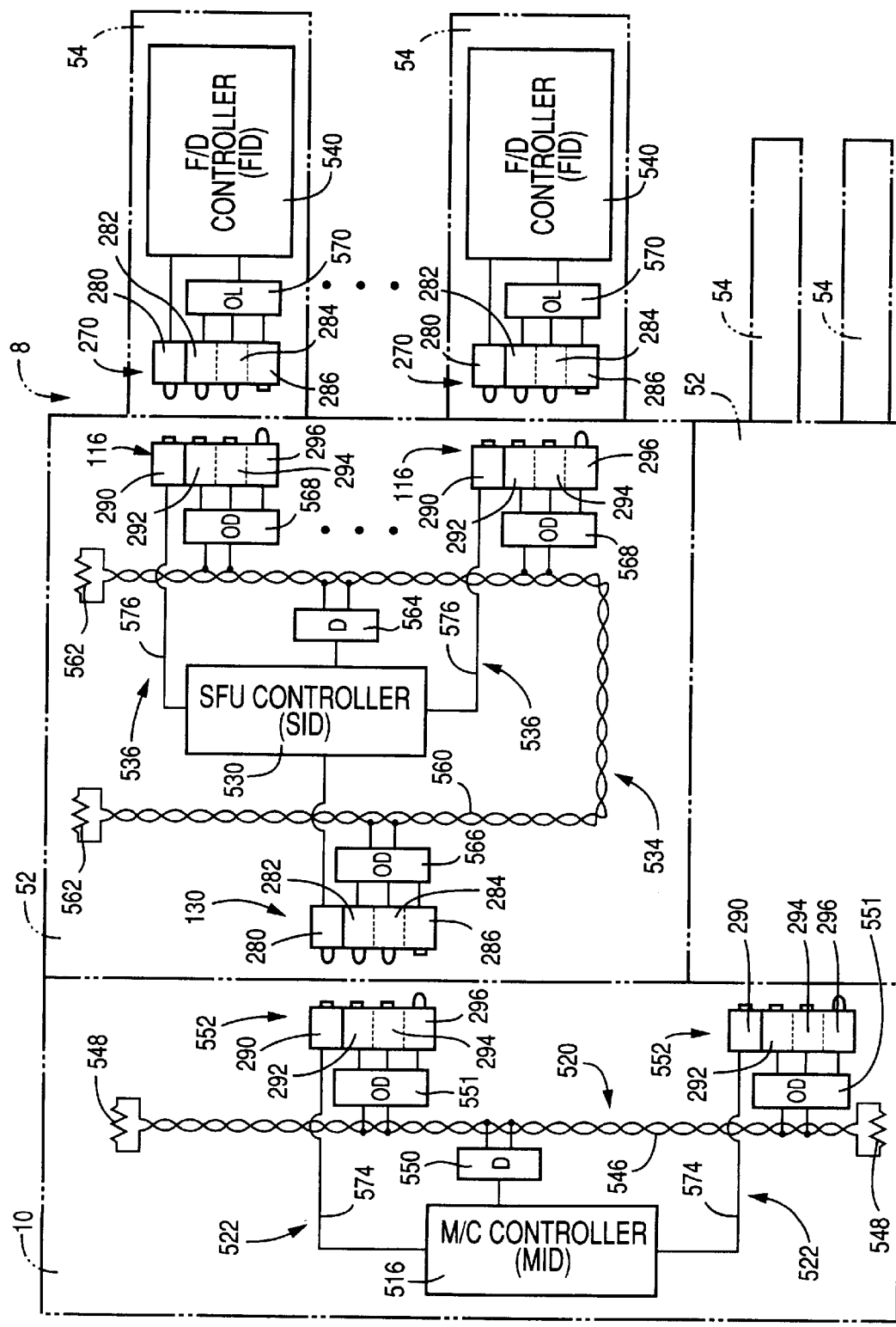
FIG. 9 is a view of respective electric systems of the CC mounting apparatus and the CC supplying apparatus of FIG. 1.

The CC mounting apparatus 10 is equipped with a mounting-apparatus-side controller in the form of an M/C controller 516 shown in FIGS. 8 and 9. The M/C controller 516 controls the air pressure supplied to the suction nozzle. 20, the operation of the PCB feeding device 14, and the operation of the X-Y-Z-θ moving device 26, so that the CCs are mounted on the PCB 16. In addition, the M/C controller 516 has the function of moving the suction nozzle 20 currently holding the CC by suction, to a predetermined position above a camera 32, so that the camera 32 takes an image of the CC held by the nozzle 20 and the controller 516 determines, based on the taken image, the positions or coordinates of the CC relative to the nozzle 20 in the X and Y directions and the angular or rotational position of the former relative to the latter in the θ direction. The M/C controller 516 can mount the CC at an accurate position on the PCB 16, by taking the thus determined positions of the CC into account. The camera 32 takes, as the image of the CC, a silhouette of the CC which is formed by the light emitted by a light source 38 and then reflected by a reflector plate 36 fixed to the nozzle 20.

The CC supplying system 50 includes two CC-supply support cars 52 (hereinafter, abbreviated to the "support car or cars" 52) each of which provides a main-body member of the CC supplying apparatus 8, a plurality of feeders 54 which are supported on each of the support cars 52 and which cooperate with each car 52 to provide the CC supplying apparatus 8, and a manager terminal which is equipped with a CC-feeder memory which stores information about the relationship between the CCs and the feeders 54. In the present embodiment, the manager terminal is provided by a laptop personal computer 502 (FIG. 8, described later).

Figure 2:
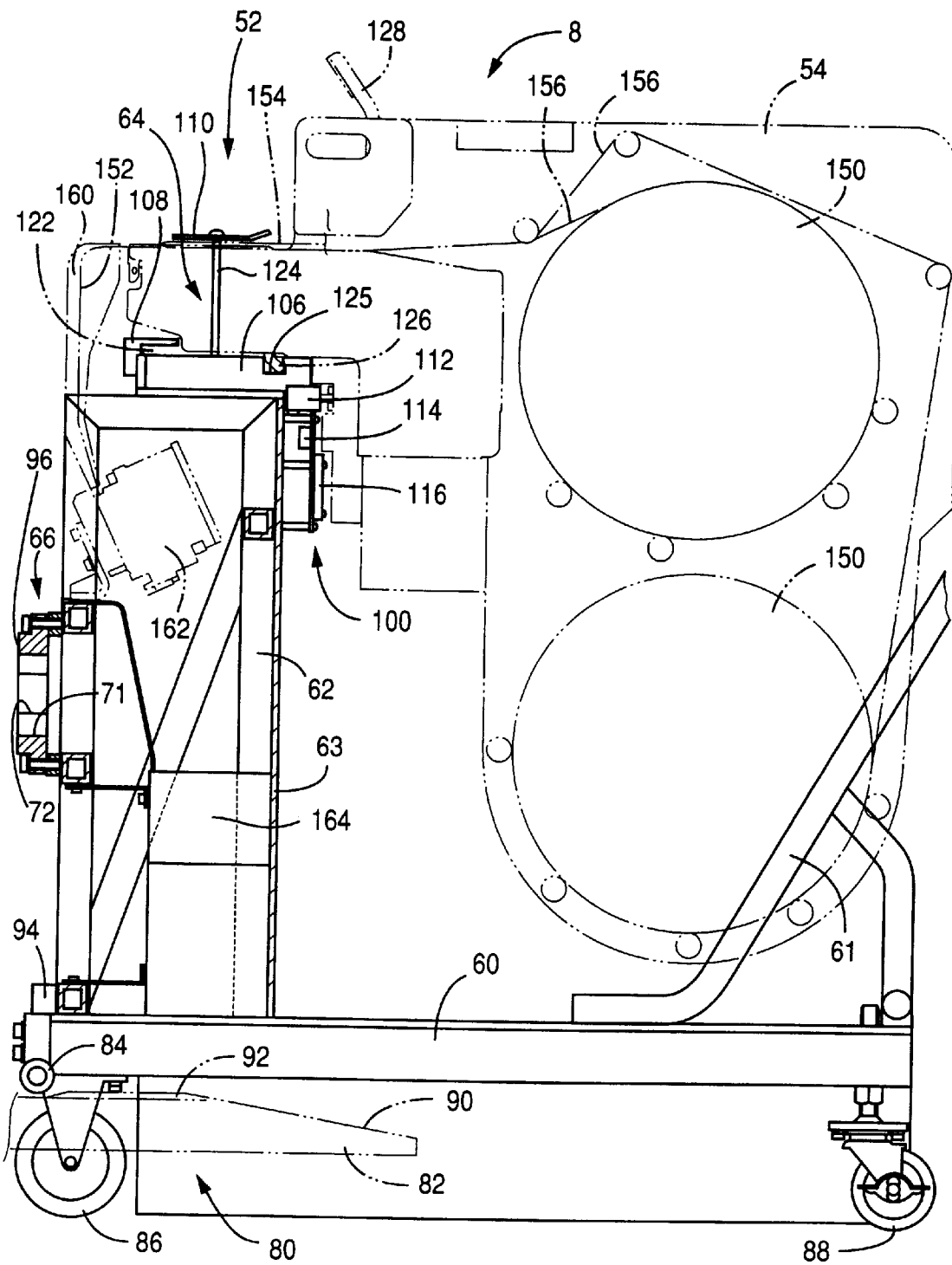
FIG. 2 is a front elevation view of the CC supplying apparatus of FIG. 1.
Figure 3:
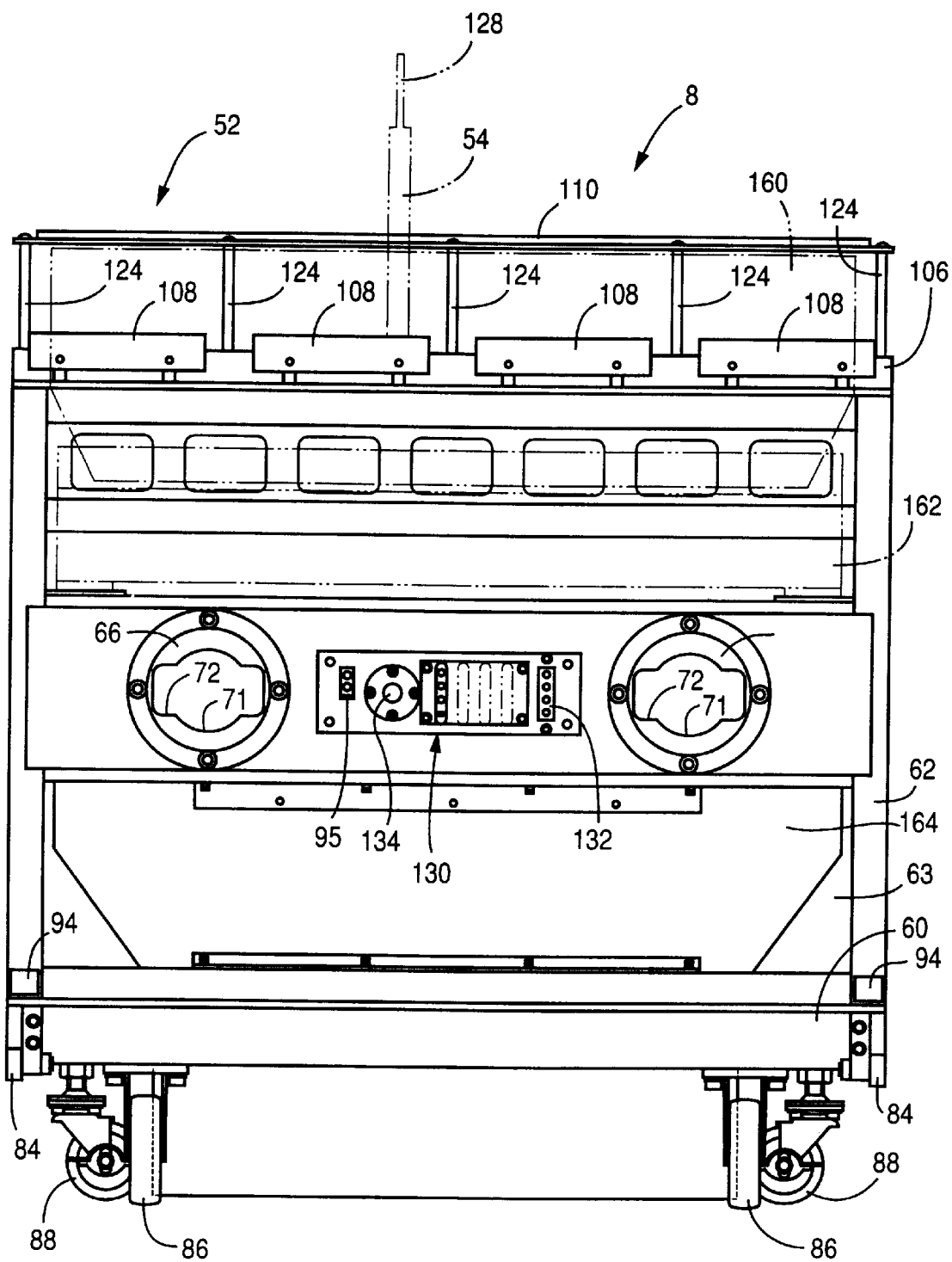
FIG. 3 is a left-hand side elevation view of the CC supplying apparatus of FIG. 1.
Figure 4:
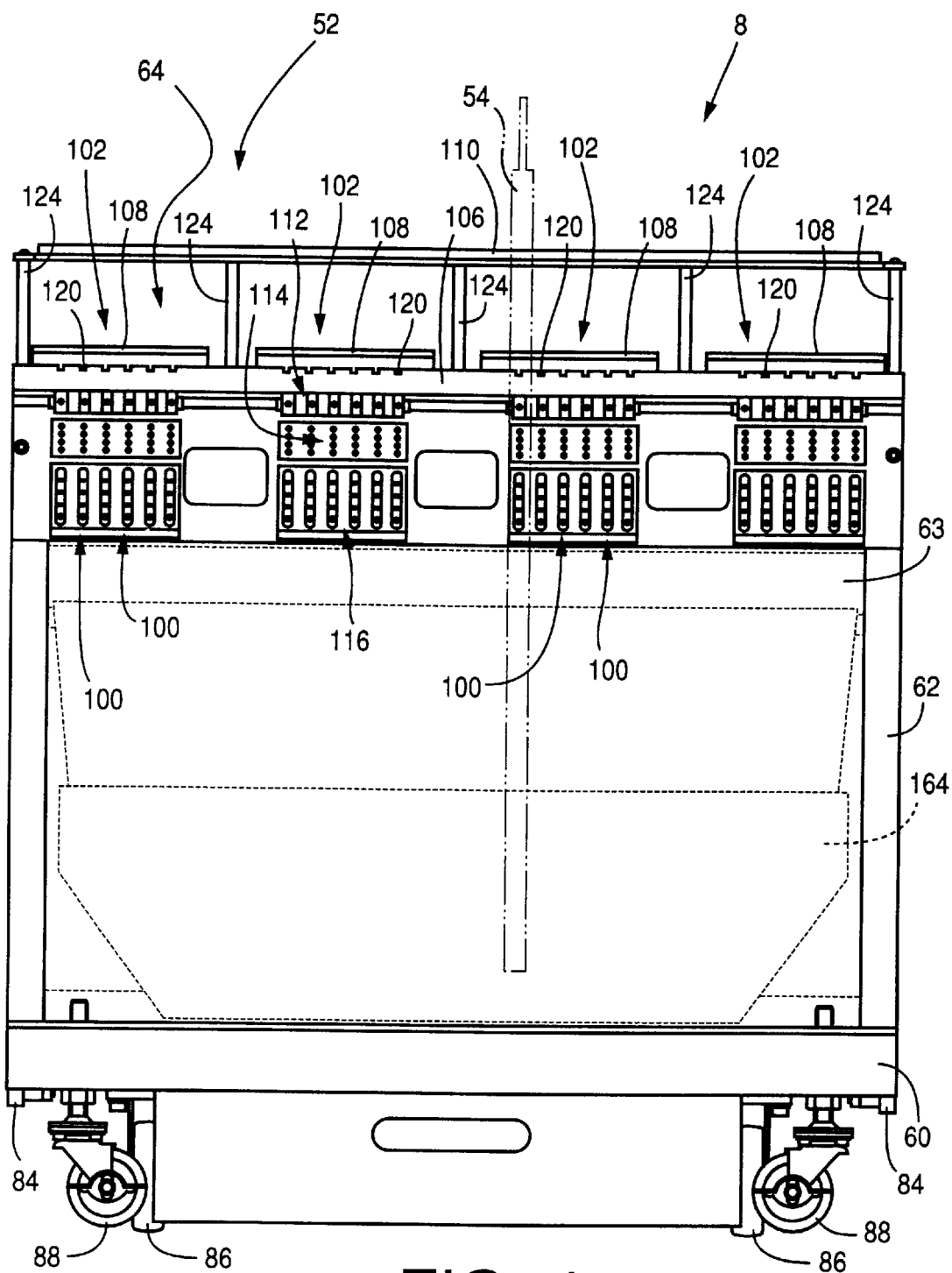
FIG. 4 is a right-hand side elevation view of the CC supplying apparatus of FIG. 1.

FIG. 2 is the front elevation view of the CC supplying apparatus 8. In the figure, the feeder 54 is illustrated in phantom lines (two-dot chain lines). This is also true with FIGS. 3 and 4 described later. The support car 52 includes a base 60, a handle 61, a frame 62 supported by the base 60, a frame plate 63 attached to the frame 62, a feeder holding device 64 provided on the frame 62, and two engaging portions 66 provided on the frame 62. FIG. 3 is the left side elevation view of the supplying apparatus 8, and FIG. 4 is the right side elevation view of the same 8. As shown in FIG. 3, the two engaging portions 66 are provided at two separate locations, respectively. In FIG. 4, the handle 61 is omitted.

As shown in FIG. 1, the two engaging portions 66 are engaged with two engaging devices 68, respectively, which are provided on the base frame 12 of the CC mounting apparatus 10, so that the support car 52 of the CC supplying apparatus 8 is combined with the CC mounting apparatus 10. Each engaging device 68 is equipped with an engaging projection 70 which has a petal-like shape and which is movable in a direction in which the support car 52 and the CC mounting apparatus 10 are arranged (i.e., a left-right direction in FIG. 1) and is rotatable about an axis line parallel to the moving direction. The above movement of the engaging projection 70 is caused by a double-action air cylinder (not shown) which is incorporated in the engaging device 68. During this movement, the projection 70 is rotated by a predetermined angle (e.g., 90 degrees) about the axis line parallel to the moving direction by a cam mechanism (not shown).

In a non-combined state in which the support car 52 is not combined with the CC mounting apparatus 10, the engaging projection 70 of each engaging device 68 projects freely in the space and takes an angular or rotational phase at which the projection 70 can fit, in an axial direction thereof, in one of the two engaging portions 66 of the support car 52. Each engaging portion 66 has an opening consisting of a circular hole 71 and a pair of side recesses 72 laterally extending from the circular hole 71 in opposite directions, respectively. When the support car 52 is moved toward the CC mounting apparatus 10 so as to be combined with the same 10, the projection 70 passes the circular hole 71 and the side recesses 72 of one of the engaging portions 66. In this state, if air is supplied to one of two pressure chambers of the air cylinder of the engaging device 68 and air is permitted to flow out of the other pressure chamber, the projection 70 is retracted, during an initial period, while being rotated in a positive direction, so that the projection 70 engages the one engaging portion 66 such that the two elements 70, 66 cannot be disengaged from each other in the axial direction of the projection 70. After this rotation, the projection 70 is moved back or retracted over a predetermined distance, so that the support car 52 is strongly combined with the CC mounting apparatus 10. If the direction of flow of air is reversed in the air cylinder, the projection 70 is moved out or advanced, during an initial period, while being not rotated, so that the support car 52 is permitted to separate from the CC mounting apparatus 10, and then the projection 70 is further advanced while being rotated in the opposite direction, so that the projection 70 is placed in a state in which the same 70 can be separated from the engaging portion 66.

Each engaging projection 70 is surrounded by a tapered guide sleeve 74 which is provided on the base frame 12 of the CC mounting apparatus 10 and which can fit in one of the engaging portions 66 in such a manner that the guide sleeve 74 does not interfere with the engagement of the engaging projection 70 and the engaging portion 66. More specifically described, the guide sleeve 74 fits in the circular hole 71 of the engaging portion 66. Since the right-hand end of the engaging projection 70 is positioned nearer to the support car 52 than that of the guide sleeve 74 as seen in FIG. 1, the guide sleeve 74 does not interfere with the engagement of the projection 70 and the engaging portion 66. Since the two guide sleeves 74 fit in the respective circular holes 71 of the two engaging portions 66, the support car 52 is accurately positioned relative to the CC mounting apparatus 10 in all directions parallel to a vertical plane parallel to the X direction.

As shown in FIG. 2, there are provided a pair of guide mechanisms 80 each of which is associated with the CC mounting apparatus 10 and the support car 52. Each guide mechanism 80 is provided by a guide member 82 which is attached to the base frame 12 of the mounting apparatus 10 and a roller 84 which is attached to the base 60 of the support car 52. FIG. 2 shows the relative position of one guide member 82 and the support car 52 in the combined state in which the car 52 is combined with the mounting apparatus 10. In this state, two fixed wheels 86 and two pivotal wheels 88 which are provided on the base 60 are separate from the floor. Also, the two rollers 84 are slightly separate from the two guide members 82, respectively. In the non-combined state, the support car 52 is supported on the floor via the two fixed wheels 86 and the two pivotal wheels 88, so that the car 52 can easily be moved on the floor.

When the support car 52 is moved toward the CC mounting apparatus so as to be combined therewith, the rollers 84 roll up to respective inclined surfaces 90 of the guide members 82, while being separated from the floor. When the car 52 further approaches the mounting apparatus 10, the two rollers 84 roll onto two guide rails 92, respectively, which are provided on the two guide members 82, respectively. The engagement of the rollers 84 with the guide rails 92 results in adjusting the position of the car 52 relative to the mounting apparatus 10 in the X direction so that the car 52 can easily be combined with the mounting apparatus 10, that is, so that the tapered guide sleeves 74 can easily fit in the circular holes 71 of the engaging portions 66, respectively. The mounting apparatus 10 is equipped with a combined-state detector (not shown). In the combined state in which the guide sleeves 74 have fit in the circular holes 71 and contact members 94 have contacted projections (not shown) projecting from the base frame 12 of the mounting apparatus, the combined-state detector detects an exclusive projection 95 (FIG. 3) provided on the car 52. When the detector detects the projection 95, the respective air cylinders of the engaging devices 68 are operated so that the projections 70 are engaged with the engaging portions 66, such that the projections 70 cannot be disengaged from the portions 66 in the axial direction of the projections 70, and the car 52 is pulled and combined with the mounting apparatus 10, as described above.

As shown in FIG. 1, when the support car 52 is pulled toward the CC mounting apparatus 10, respective contact surfaces 96 of the engaging portions 66 contact respective contact surfaces 97 of the engaging devices 68, and the contact members 94 of the car 52 contact respective projections (not shown) formed on the base frame 12 of the mounting apparatus 10. Thus, the car 52 is accurately positioned relative to the mounting apparatus 10 in the Y direction in which the car 52 is moved relative to the apparatus 10 so as to be combined therewith. Hereinafter, a vertical plane which is defined by the contact surfaces 97 and the respective contact surfaces of the above-indicated projections (not shown) will be referred as the "combining plane", and a direction normal to the combining plane will be referred to as the "combining direction", when appropriate. The engaging devices 68 pull the engaging projections 70 toward the mounting apparatus 10, with a force greater than a force which is needed to move up the car 52 such that the pivotal wheels 88 are separated from the floor and the rollers 84 are separated from the guide rails 92. Accordingly, the car 52 is strongly combined with the mounting apparatus 10. For example, each engaging device 68 pulls the corresponding projection 70 with a force of about 250 kgf (i.e., about 2,450 N).

The feeders 54 are held by a plurality of feeder holding units 100 of the feeder holding device 64, respectively, on the support car 52. The feeder holding device 64 includes, as a main body member thereof, a base plate 106 (described below). In the present embodiment, the base plate 106 provides a feeder holder, and the feeder holding units 100 provide feeder holding portions of the feeder holder, respectively. As shown in FIG. 4, the feeder holding device 64 has four feeder-holding-unit groups 102 each group of which consists of six successive feeder holding units 100. Accordingly, the feeder holding device 64 can hold at most twenty-four feeders 54. Hereinafter, the four groups of units 102 will be referred to as the first to fourth groups of units 102, respectively, in the order from the left-hand side to the right-hand side in FIG. 4.

As shown in FIG. 2, each feeder holding unit ("FHU") 100 includes a base plate 106, an engaging member 108 and a guide plate 110 which are supported by the base plate 106, an air supply section 112 which supplies pressurized air to the feeder 54, an electric-power supply section 114 which supplies electric power to the feeder 54, and an S/F communication section 116 which serves as an interface for communication between the feeder 54 and the support car 52. The letter "S" of the combination "S/F" indicates the support car 52, and the letter "F" indicates the feeder 54. The order of the letters "S" to "F" in the combination "S/F" indicates that the pertinent element (i.e., section 116) is provided on the car 52 and is used in connection with the feeder 54. Therefore, each feeder 54 is equipped with an F/S communication section 270 (described later) for communication with the S/F communication section 116. The base plate 106 and the guide plate 110 are shared by all the FHUs 100, and the engaging member 108 is shared by the six FHUs 100 of each of the four FHU groups 102.

As shown in FIG. 4, the base plate 106 has a plurality of engaging grooves 120 corresponding to the FHUs 100, respectively. Each feeder 54 has an engaging projection 122 which is engageable with one engaging groove 120 and one engaging member 108. When each feeder 54 is held by one FHU 100, the feeder 54 is moved in the direction from the right-hand side toward the left-hand side in FIG. 2, so that finally the feeder 54 is held at a position shown in FIG. 2. Since the engaging projection 122 of the feeder 54 held by the FHU 100 is engaged with the engaging groove 120 of the base plate 106, the feeder 54 is inhibited from moving relative to the FHU 100 in the X direction. In addition, the guide plate 110 which is attached to the base plate 106 via a plurality of columns 124 permits only slight movements of the feeder 54 in a vertical direction in a plane normal to the X direction. These features enable an operator to attach or detach easily each feeder 54 to or from one FHU 100 by engaging or disengaging smoothly the engaging projection 122 with or from the engaging member 108. In the attached state shown in FIG. 2, the engaging projection 108 is engaged with the engaging member 108 and accordingly the feeder 54 is inhibited from moving relative to the base plate 106 in the Z direction.

Each feeder 54 is equipped with a generally U-shaped engaging member 126 (FIG. 6) which is engageable with an engaging groove 125 formed in the base plate 106 so as to bias the feeder 54 toward the frame 62 (i.e., leftward in FIG. 2). While a lever 128 is not operated, the engaging member 126 projects outward from the feeder 54, as shown in FIG. 2. On the other hand, while the lever 128 is operated, the member 126 is retracted into an internal space of the feeder 54. A mechanism for retracting the member 126 into the feeder 54 will be described later by reference to FIG. 6. In the process in which each feeder 54 is held by one FHU 100, the lever 128 is operated so that the engaging member 126 is retracted into the feeder 54. However, if the lever 128 is released for stopping the operation thereof, the feeder 54 is firmly held by the FHU 100. Each feeder 54 can easily be removed from the FHU 100 by first operating the lever 128 for retracting the engaging member 126 into the feeder 54 and subsequently moving the feeder 54 rightward in FIG. 2.

The support car 52 is equipped with a supplying-apparatus-side controller or a holding-member-side controller in the form of an SFU controller 530 (FIG. 8, described later). The SFU controller 530 can communicate information with the M/C controller 516 via an S/M communication section 130 shown in FIG. 3. Like the letter combination "S/F", the letter "S" of the combination "S/M" indicates the support car 52, and the letter "M" indicates the CC mounting apparatus 10. Therefore, the mounting apparatus 10 is equipped with an M/S communication section 552 (FIG. 8, described later) for communication with the S/M communication section 130. The M/S section 130 is connected to the M/C controller 516. The SFU controller 530 is connected to the respective S/F sections 116 of all the FHUs 100. The interactions between the M/C controller 516 and the SFU controller 530 will be described later.

The support car 52 is equipped with an electric-power receiving section 132 for receiving electric power from the CC mounting apparatus 54, and an air receiving section 134 for receiving pressurized air from the same 10.

As shown in FIG. 2, each feeder 54 can hold at most two CC tape reels 150 each of which stores a CC carrier tape 156 which carries a plurality of CCs (circuit components) of a same sort. The CC carrier tape 156, which is wound around the tape reel 150, includes a CC accommodating tape 152 having a plurality of CC accommodating pockets each for accommodating a CC, and a cover tape 154 for covering the respective upper openings of the accommodating pockets. The cover tape 154 is adhered to the accommodating tape 152 for preventing the CCs from coming out of the accommodating pockets. The cover tape 154 is peeled from the accommodating tape 152 at a position which is adjacent to the position of the suction nozzle 20 shown in FIG. 1 where the nozzle 20 sucks up each CC and is on the side of the tape reel 150 with respect to the nozzle 20 (i.e., on the right-hand side of the nozzle 20 in FIG. 1). The accommodating tape 152 from which the CCs have been sucked up by the suction nozzle 20 is fed toward the side of the CC mounting apparatus 10 (i.e., leftward in FIG. 2), at a feeding pitch which is equal to a CC-accommodating pitch at which the CCs are accommodated by the tape 152 in the longitudinal direction thereof. More specifically, the tape 152 from which the CCs have been taken is fed to a cutting machine 162 while being guided by a tape guide 160. The tape guide 160 and the cutting machine 162 are supported by the frame 62. The cutting machine 162 cuts the tape 152 into small pieces which are collected in a container 164 provided below the frame 62. The manner in which the cover tape 154 peeled from the accommodating tape 152 is dealt with will be described later. In FIGS. 2 and 3, the tape guide 160 and the cutting machine 162 are indicated in phantom lines (two-dot chain lines).

Next, the construction of each feeder 54 employed in the CC supplying system 50 will be described in detail.

Figure 5:
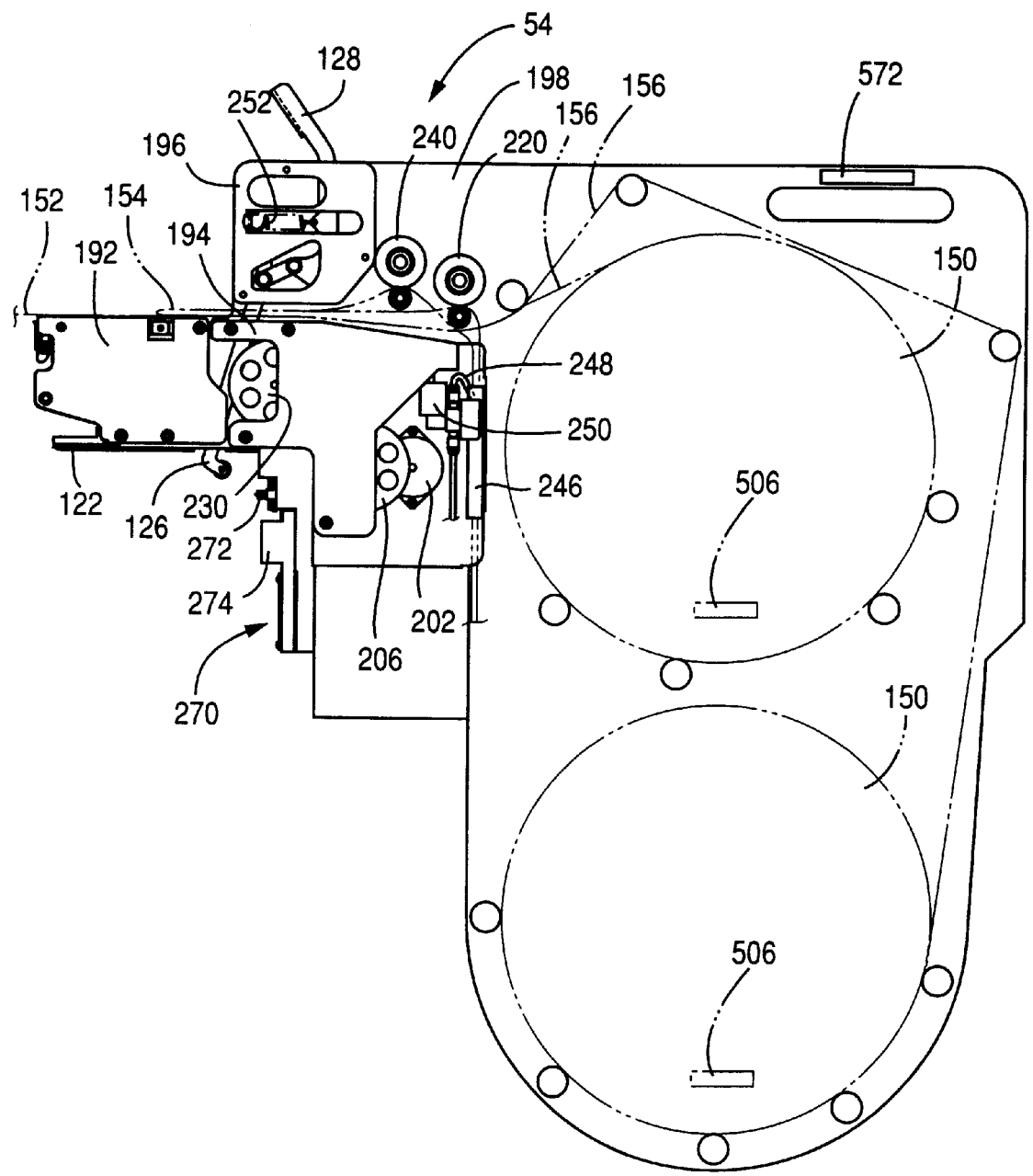
FIG. 5 is a front elevation view of a feeder as an element of the CC supplying apparatus of FIG. 1.

FIG. 5 is a front elevation view of each feeder 54. As described above, each feeder 54 can support at most two CC tape holders 150 each of which holds a plurality of CCs of a same sort. Each feeder 54 can feed, based on a supply command or commands from the SFU controller 530, CCs of a first sort one by one from one of the two reels 150 and CCs of a second sort one by one from the other reel 150, such that the feeding of CCs from the one reel 150 is independent of that from the other reel 150. The first and second sorts may be the same as each other, or may be different from each other. Therefore, each feeder 54 can simultaneously feed the CCs from both of the two reels 150. However, since the CC mounting apparatus 10 has only the single suction nozzle 20, the SFU controller 530 does not generate, under normal conditions, any supply command that the feeder 54 should simultaneously supply the CCs from both the two reels 150. For the same reason, the SFU controller 530 does not simultaneously send a plurality of supply commands to a plurality of feeders 54, respectively.

Figure 6:
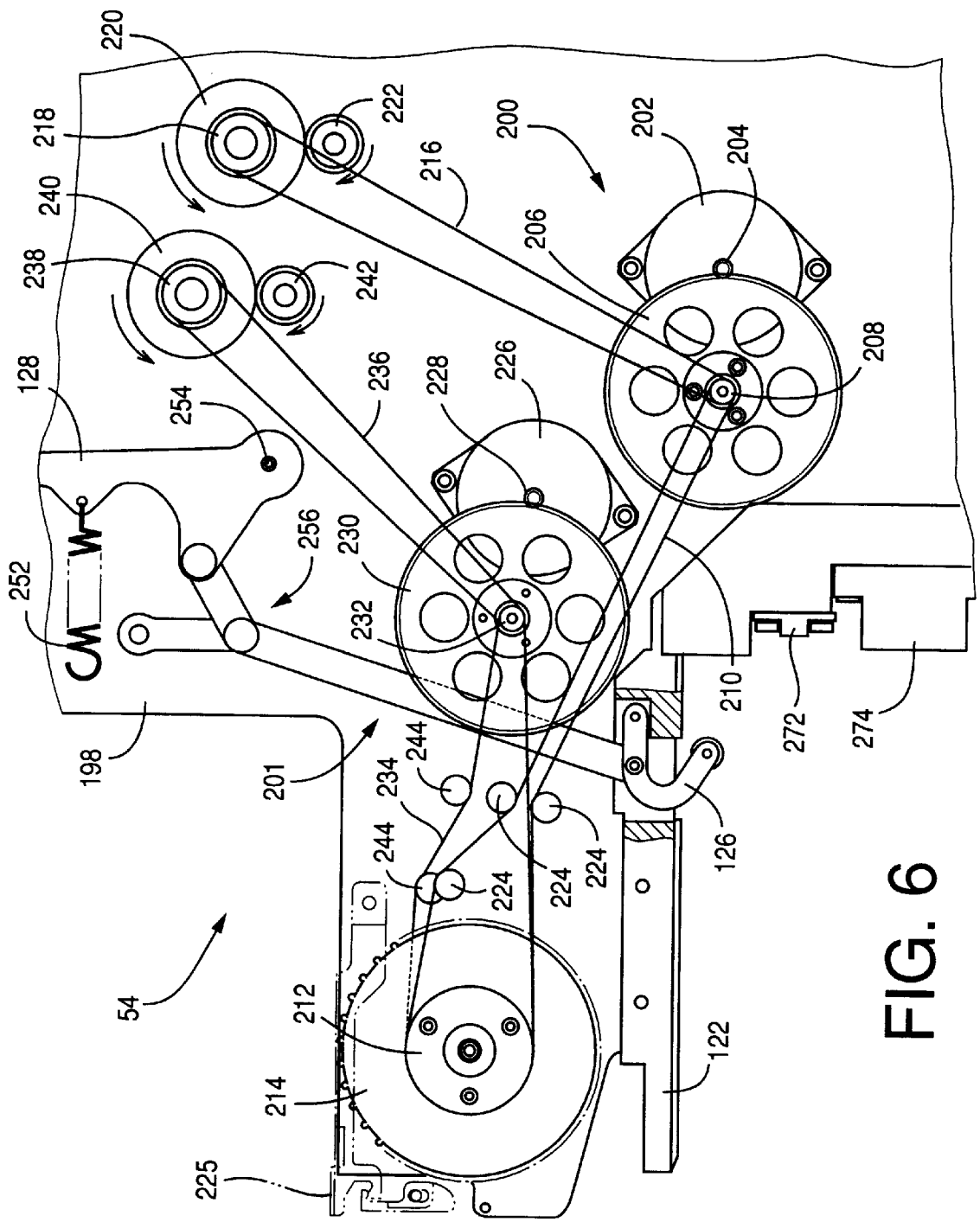
FIG. 6 is an enlarged front elevation view of a portion of the feeder of FIG. 5.

FIG. 6 is a front elevation view of a part of one of the feeders 54, with a first, a second, and a third cover member 192, 194, 194 shown in FIG. 5 being removed for easier understanding purposes only. Each feeder 54 includes two drive devices 200, 201, each attached to a side plate 199, for feeding the two CC carrier tapes 156 from the two tape reels 150, respectively. The first drive device 200 includes an electric motor 202, a drive gear 204 which is fixed to an output shaft of the motor 202, a driven gear 206 which is meshed with the drive gear 204 and has more teeth than those of the drive gear 204, a drive pulley 208 which is formed integrally with the driven gear 206, a drive belt 210 which transmits the rotation force of the drive pulley 208, a driven pulley 212 which is driven by the driven belt 212, and a sprocket 214 which is formed integrally with the driven pulley 212. In addition, the first drive device 200 includes a drive belt 216 which transmits the rotation of the drive pulley 208, a driven pulley 218 which is driven by the driven belt 216, a drive pinch roller 220 which is formed integrally with the driven pulley 218, and a driven pinch 222 which is held in pressed contact with an outer circumferential surface of the driven pinch 220 with a predetermined pressure. Thus, the rotation of the motor 202 is transmitted to the sprocket 214 and the two pinches 220, 222.

The drive belt 210 circulates along a route defined by a plurality of guide rollers 224. Since the electric motor 202 is a stepper motor, the amount or angle of rotation of the sprocket 214 can be controlled by changing a number of pulse signals which are supplied to the motor 202. Those pulse signals are supplied by a feeder-side controller in the form of an F/D controller 540 (FIG. 8, described later). The ratio of a rotation angle of the motor 202 to a corresponding rotation angle of the sprocket 214 is equal to the product of a gear ratio of the drive gear 204 and the driven gear 206 and a ratio of the radius of the drive pulley 208 to the radius of the driven pulley 212. The CC accommodating tape 152 has perforations which are successive at a regular interval of distance in the longitudinal direction thereof and which are engageable with projections which are formed at a regular interval of distance on an outer circumference of the sprocket 214. A cover member 225 is provided for preventing the accommodating tape 152 from moving up away from the sprocket 214 and thereby surely engaging the tape 152 with the sprocket 214.

When the sprocket 214 is rotated, the CC carrier tape 156 is subjected to a tension caused by, e.g., frictional resistance produced when the corresponding tape reel 150 is rotated. In addition, the drive belt 210 is subjected to a tension caused by, e.g., the friction produced when the guide rollers 224 are rotated. However, in the present embodiment, each feeder 54 can easily feed the carrier tape 156 at any desired feeding pitch, by changing the number of pulse signals supplied to the electric motor 202, irrespective of whether those disturbances may be small or large. Therefore, even if a first CC carrier tape 156 may be replaced with a second CC carrier tape 156 whose CC-accommodating pitch (i.e., regular interval at which CCs are accommodated by its CC-accommodating tape 152 in the longitudinal direction thereof) is different from that of the first tape 156, each feeder 54 can easily adapt itself to that occasion. The pinches 220, 222 are held in pressed contact with each other under a predetermined pressure, and the cover tape 154 peeled from the CC accommodating tape 152 is pinched by the two pinch rollers 220, 222, as shown in FIG. 5. When the CC carrier tape 156 is fed forward by the sprocket 214, the rollers 220, 222 cooperate with each other to send the peeled cover film 154 rearward to the side of the corresponding reel 150, so that the cover tape 154 is further peeled little by little from the accommodating tape 152. The cover-tape sending pitch at which the cover tape 154 is sent back by the pinches 220, 222 is larger than the carrier-tape feeding pitch at which the CC carrier tape 156 is fed by the sprocket 214. Since the position where the cover tape 154 is peeled from the accommodating tape 152 is defined and fixed by a cover-tape drawing slit which is formed through the thickness of the cover member 225, an excessive length of the cover-tape sending pitch is absorbed or accommodated by the sliding of the pinch rollers 220, 222 on the cover tape 154. Thus, the length of the cover tape 154 between the cover member 225 and the rollers 220, 222 is held stretched out.

Like the first drive device 200, the second drive device 201 includes an electric motor 226, a drive gear 228, a driven gear 230, a drive pulley 232, driven belts 234, 236, a driven pulley 238, pinch rollers 240, 242, and guide rollers 244. The second drive device 201 additionally includes a sprocket (not shown) similar to the sprocket 214, and a driven pulley (not shown) similar to the driven pulley 212. The sprocket and driven pulley of the second drive device 201 are aligned with the sprocket 214 and driven pulley 212 of the first drive device 200, and are not shown in FIG. 6. The cover tape 154 sent back by the pinch rollers 220, 222 and the cover tape 154 sent back by the pinch rollers 240, 242 are passed through a pipe 246 whose axis line is vertical, as shown in FIG. 5, so that the cover tapes 154 fall down onto the base 60. Accordingly, in the attached state in which each feeder 54 is attached to one FHU 100, the waste cover tapes 154 are collected on the base 60 of the support car 52. An air nozzle 248 is provided for passing smoothly the cover tapes 154 through the pipe 246. When at least one of the electric motors 202, 226 is driven or rotated, pressurized air is supplied to the air nozzle 248 which in turn supplies the air to the pipe 246 from the top inlet thereof. A solenoid-operated valve 250 is opened to supply the pressurized air to the air nozzle 248. The solenoid valve 250 is controlled by the F/D controller 540.

Each feeder 54 is equipped with some manually operable switches (not shown) which are connected to the F/D controller 540. Those switches include ones for rotating each one of the electric motors 202, 226 in opposite directions, independent of the other motor; ones for selecting a speed at which each one of the motors 202, 226 is rotated for supplying CCs; ones for selecting a rotation angle of each one of the motors 202, 226 for supply each one of CCs; and ones for selecting each one of the drive devices 200, 201 for being operated. Based on the respective current states or positions of those switches, the F/D controller 540 controls various sections of the feeder 54.

As shown in FIG. 6, the lever 128 of each feeder 54 is biased by a biasing member in the form of a spring 252 in a direction in which the lever 128 is rotated counterclockwise about an axis member 254. This biasing force is transmitted to the engaging member 126 via a link mechanism 256, so that while the lever 128 is not operated, the engaging member 126 projects outward from the feeder 54. The engaging member 126 can be retracted into the feeder 54, by rotating the lever 128 clockwise about the axis member 254.

Figure 7:
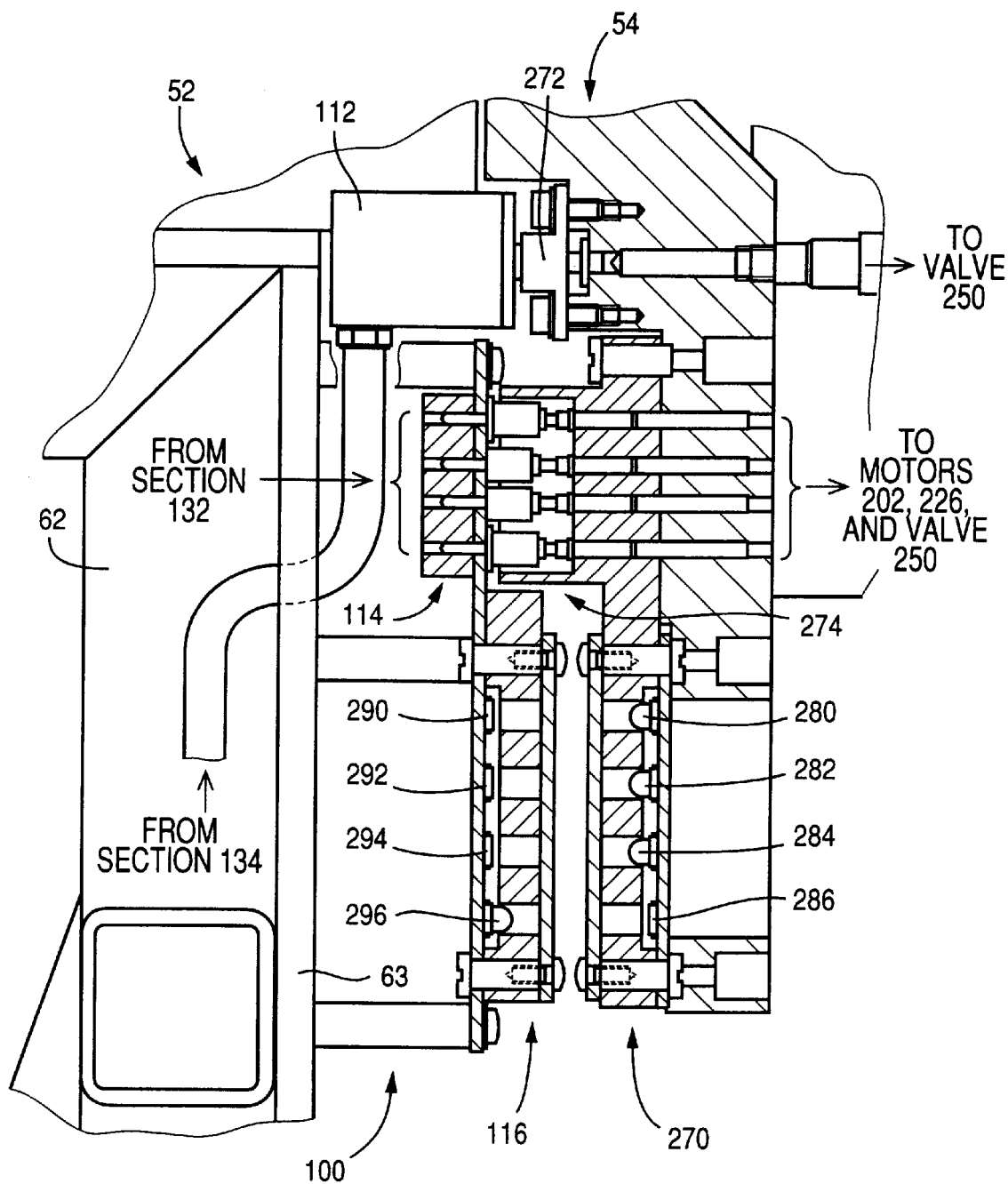
FIG. 7 is an enlarged, partly cross-sectional, front elevation view of a portion of a feeder holding unit ("FHU") of the CC supplying apparatus and a portion of the feeder of FIG. 5 held by the FHU.

FIG. 7 is an enlarged view of a part of one of the feeders 54 which is held by one FHU 100. Each feeder 54 has an F/S communication section 270 which is optically connected to the S/F communication section 116 of the FHU 100. The SFU controller 530 communicates information with the F/D controller 540 via those sections 116, 270. The feeder 54 is equipped with an air receiving section 272 which fits on the air supply section 112 for receiving pressurized air therefrom, so that the pressurized air is supplied to the above-described solenoid valve 250. In addition, the feeder 54 is equipped with an electric-power receiving section 274 which is electrically connected to the electric-power supply section 114 for receiving electric power therefrom, so that the electric power is supplied to the F/D controller 540, the electric motors 202, 226, etc. Each feeder 54 is supplied with two independent electric currents, one (e.g., with a DC voltage of 5 V) is to be used for the F/D controller 540 and the other (e.g., with a DC voltage of 24 V) is to be used for the motors 202, 226 and the solenoid valve 250. The electric power is supplied from the CC mounting apparatus 10 to the support car 52. The car 52 has a second electric-power receiving section (not shown) for receiving electric power in the non-combined state in which the car 52 is not combined with the mounting apparatus 10, e.g., during a preparing operation prior to the CC mounting operation.

The F/S communication section 270 includes three light emitters 280, 282, 284 and a light receiver or detector 286. The S/F communication section 116 includes three light detectors 290, 292, 294 for detecting the lights emitted by the three light emitters 280, 282, 284 of the F/S section 270, respectively, and a light emitter 296 for emitting a light toward the light detector 286 of the F/S section 270. The combination of the light emitter 282 of the F/S section 270 and the light detector 292 of the S/F section 116 is used when the F/D controller 540 transmits information or signals to the SFU controller 530, and the combination of the light emitter 284 and the light detector 294 is used for helping that transmission. More specifically described, the SFU controller 530 receives, as communication signals, only the signals which are received by the light detector 292 while the light detector 284 detects the light emitted by the light emitter 284. This is a countermeasure employed for preventing the SFU controller 530 from erroneously receiving, as the communication signals, foreign lights in a state in which each FHU 100 does not hold any feeder 54. Hereinafter, this measure will be referred as the "erroneous-communication preventing measure". The combination of the light detector 286 of the F/S section 270 and the light emitter 296 of the S/F section 116 is used when the SFU controller 530 transmits information or signals to the F/D controller 540.

In the present embodiment, the light detectors 292, 294 and the light emitter 296 of the S/F communication section 116 provides a first holder-side connection section; the light detector 290 of the S/F communication section 116 provides a second holder-side connection section; the light emitters 282, 284 and the light detector 286 of the F/S communication section 270 provides a first feeder-side connection section; and the light emitter 280 of the F/S communication section 270 provides a second feeder-side connection section.

Next, there will be described interactions among the M/C controller 516 of the CC mounting apparatus 10, the SFU controller 530 of the support car 52, and the F/D controller 540 of each feeder 54.

FIG. 8 is a block diagram representing an electric control system of the present CC mounting system 500. The CC mounting system 500 includes the CC mounting apparatus 10, two support cars 52, a plurality of feeders 54 which are held by each of the two support cars 52, the laptop ("LT") computer 502 as the manager terminal, and a host computer 504.

The host computer 504 manages the CC mounting apparatus 10, and has a memory which stores CC data base including one or more sets of CC information that is or are information about one or more sorts of CCs. More specifically described, the CC data base includes a look-up table which indicates a set of CC information about each sort of CCs, and a corresponding CC identification code given to a CC carrier tape 156 carrying that sort of CCs. The CC identification code is a bar code, and a CC bar code label 506 on which the bar code is printed is adhered to a CC tape reel 150 (FIG. 5) supporting the CC carrier tape 156. The set of CC information includes the position of each CC on the CC carrier tape 156 (e.g., the position of a reference point of each CC relative to the CC accommodating tape 152), the CC-accommodating pitch, the number of remaining CCs, etc. The set of CC information may additionally include one or more of the sort of CCs, the type of CCs, the manufacturing date of CCs, the manufacturer name of CCs, the amount of CCs in stock, the amount of CCs expected to be used, the date when CCs are to be used, etc. In the present embodiment, the inventory management of CCs is carried out on the CCs which are held or stored by the CC tape reels 150.

In the present CC mounting system 500, at most two support cars 52 can simultaneously be combined with the CC mounting apparatus 10. Accordingly, the mounting apparatus 10 is equipped with two combining devices each of which is provided by the pair of engaging devices 68, an M/S communication section 552, etc. Each support car 52 can be combined by any of the two combining devices. Likewise, each feeder 54 can be held by any of the FHUs 100 attached to the two cars 52. Therefore, the position where each car 52 is combined with the CC mounting apparatus 10 can be changed, and the position where each feeder 54 is held by a car 52 can be changed.

The M/C controller 516 needs to know the position where each CC is to be supplied, when it controls the suction nozzle 20 to suck the CC and mount it on the PCB 16. Without this information, the controller 516 cannot control the X-Y-Z-θ moving device 26. Therefore, if each car 52 is combined with the CC mounting apparatus 10 at an erroneous position, and/or if each feeder 54 is held by a car 52 at an erroneous position, the CCs fed by each feeder 54 would be mounted at erroneous positions on the PCB 16. The present CC mounting system 500 can prevent the above erroneous mounting of CCs as described below.

As shown in FIG. 8, the host computer 504 and the CC mounting apparatus 10 are connected to each other via a host network 510. The host network 510 may be provided by LAN (local area network) having a network structure of a bus type, a loop type, or the like. In many cases, LAN communicates serial data via a single communication line. However, the host network 510 may be provided by a bus which is used as an internal bus of a computer, such as VME bus, PCI bus, or the like. In any case, the host computer 504 and the CC mounting apparatus 10 can communicate every sort of information including CC information with each other. In the present embodiment, the host network 510 is provided by a VME bus.

In the CC mounting apparatus 10, the M/C controller 516 carries out the communication with the host computer 504, the control of the PCB feeding device 14, the control of the X-Y-Z-θ moving device 26, the control of the suction nozzle 20 to suck the CCs, the communication with the SFU controller 530, the communication with the F/D controllers 540, and so on. The CC mounting apparatus 10 includes an M/C network 520 and an SPID network 522, which are connected to the M/C controller 516 in manners described later.

Each of the two support cars 52 is equipped with the SFU controller 530 as described previously. The SFU controller 530 carries out the communication with the M/C controller 516, the communication with the F/D controller 540 of each feeder 54, and the like. Each support car 52 includes an SFU network 534 as a first communication network and an FPID network 536 as a second communication network, which are connected to the SFU controller 530 in manners described later.

The F/D controller 540 of each feeder 54 carries out the communication with the M/C controller 516, the communication with the SFU controller 530 of the corresponding support car 52, and the control of the electric motors 202, 226.

With the M/C network 520 and the SFU network 534, the M/C controller 516, the respective SFU controllers 530 of the two support cars 52, and the respective F/D controllers 540 can communicate information with one another. On the other hand, as previously described, each feeder 54 can be held by any of the FHUs 100 of any of the two support cars 52, and each car 52 can be combined with any of the two combining devices each of which is provided by the pair of engaging devices 68, the M/S communication section 552, etc. Accordingly, each SFU controller 530 can be connected to the M/C controller 516 at any of the two positions, and each F/D controller 540 can be connected to one SFU controller 530 at any of the twenty-four positions. However, while the M/C controller 516 communicates with one of the two SFU controllers 530, the M/C controller 516 cannot identify which one of the two combining devices 68, 552 is currently used for combining the CC mounting apparatus 10 with the support car 52 having that one SFU controller 530, because of the structures of the M/C network 520 and the SFU networks 534 which will be described later. Likewise, the M/C controller 516 cannot identify which one of the twenty-four FHUs 100 is currently used for holding one of at most the twenty-four feeders 54 on one car 52 which has the F/D controller 540 with which the M/C controller 516 is currently communicating. Hence, the SPID network 522 is employed for solving the first problem, and the FPID network 536 is employed for solving the second problem.

FIG. 9 is a block diagram representing respective communication-related constructions of the CC mounting apparatus 10 and each support car 52. As shown in FIG. 9, the M/C network 520 is provided by twisted paired lines 546, terminal resistors 548, a bus driver 550, optical link drivers 551, respective portions of the M/S communication sections 552, and so on. Each M/S communication section 552 has the same construction as that of each S/F communication section 116 shown in FIG. 7. That is, the M/S section 552 includes light detectors 290, 292, 294 and a light emitter 296. The M/S network 520 includes the light detectors 292, 294 and the light emitter 296. The bus driver 550 which may be one in accordance with RS-485 is used to connect the M/C controller 516 to the twisted paired lines 546. Each optical link driver 551 connects a corresponding M/S section 552 to the paired lines 546, and has the function of sharing receiver-side portion of the previously described erroneous-communication preventing measure. In the M/S network 520, the bus driver 550 or each link driver 551 can be connected to any position of the paired lines 546. The respective numbers of the drivers 500, 501 are not limited to those of the present embodiment.

The SFU network 534 is provided by twisted paired lines 560, terminal resistors 562, a bus driver 564, optical link drivers 566, 568, a portion of the S/M communication section 130, respective portions of the S/F communication sections 116, and so on. The S/M communication section 130 has the same construction as that of each F/S communication section 270 shown in FIG. 7. That is, the S/M section 130 includes light emitters 280, 282, 284 and a light detector 286. The SFU network 534 includes the light emitters 282, 284 and the light detector 286. The bus driver 564 is similar to the bus driver 550 of the M/C network 520, and the optical link drivers 568 are similar to the optical link drivers 551. The optical link driver 566 can cooperate with each one of the optical link drivers 551, and has the function of sharing a transmitter-side portion of the previously described erroneous-communication preventing measure. The SFU network 534 includes the light detectors 292, 294 and the light emitter 296 of each S/F communication section 116 which correspond to the light emitters 282, 284 and the light detector 286 of the F/S communication section 270 of one feeder 54, respectively. The light emitters 282, 284 and the light detector 286 of each F/S section 270 are connected to the F/D controller 540 via an optical link 570. Like the optical link driver 566, each optical link 570 has the function of sharing a transmitter-side portion of the previously described erroneous-communication preventing measure, but does not function as a bus driver for communicating signals with paired lines.

There have been proposed various communication methods for use in data communication through a network such as the M/C network 520 or the SFU network 534. The present CC mounting system 500 employs a widely used CSMA/CD (carrier sense multiple access with collision detection) method. Since the CSMA/CD method is well known in the art, the detailed description thereof is omitted. Only the characteristics of this method which are useful for the further description are described below.

In the CSMA/CD method, a plurality of "nodes" share a single communication line. To this end, each of the nodes controls itself so that two or more nodes do not simultaneously transmit data via the single line. That is, the collision of data on the line is prevented by time sharing. The term "node" generally means a port or inlet to a communication network and, in the present embodiment, the nodes comprise the M/C controller 516, the SFU controllers 530, and the F/D controllers 540. The "self control" carried by each node consists essentially of the following two operations:

(1) The Control of Transmission Based on Carrier Sense

Each node senses or identifies whether there is any communication data ("carrier") moving on the network. If not, only the node that has identified that can transmit data using the network. However, with this control only, a plurality of nodes can simultaneously identify that there is no carrier on the network. In the latter case, a plurality of communication data transmitted from the plurality of nodes can collide with each other on the network.

(2) The Control of Transmission and Reception Based on Collision Detection

Each node detects or identifies whether data transmitted therefrom to a destination node collides with another set of data transmitted from another node. If each node identifies the collision, each node informs the destination node of the collision, and then re-transmit the same data to the destination node. The destination node discards the received data if the data have been collided.

Data transmitted from one node are received by all the nodes including the one node. However, data include an address specifying a destination node which is to obtain the data. Each node has its own address, and knows respective addresses of all the nodes including the each node itself. The destination node detects the address included in the received data, and judges whether the received data should be obtained by itself.

Figure 10:
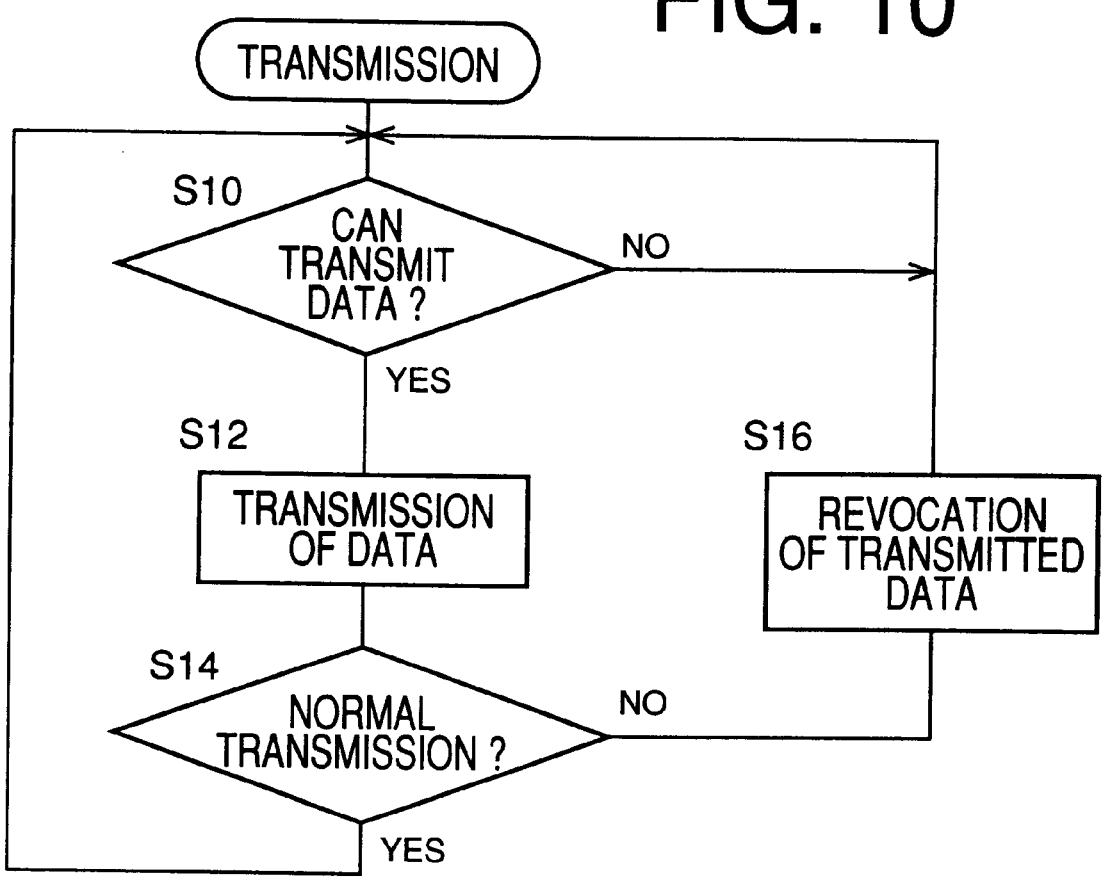
FIG. 10 is a flow chart representing an operation of a transmitter as a node in an M/C communication network of the CC mounting apparatus of FIG. 1 and an SFU communication network of the CC supplying apparatus of FIG. 1.
Figure 11:
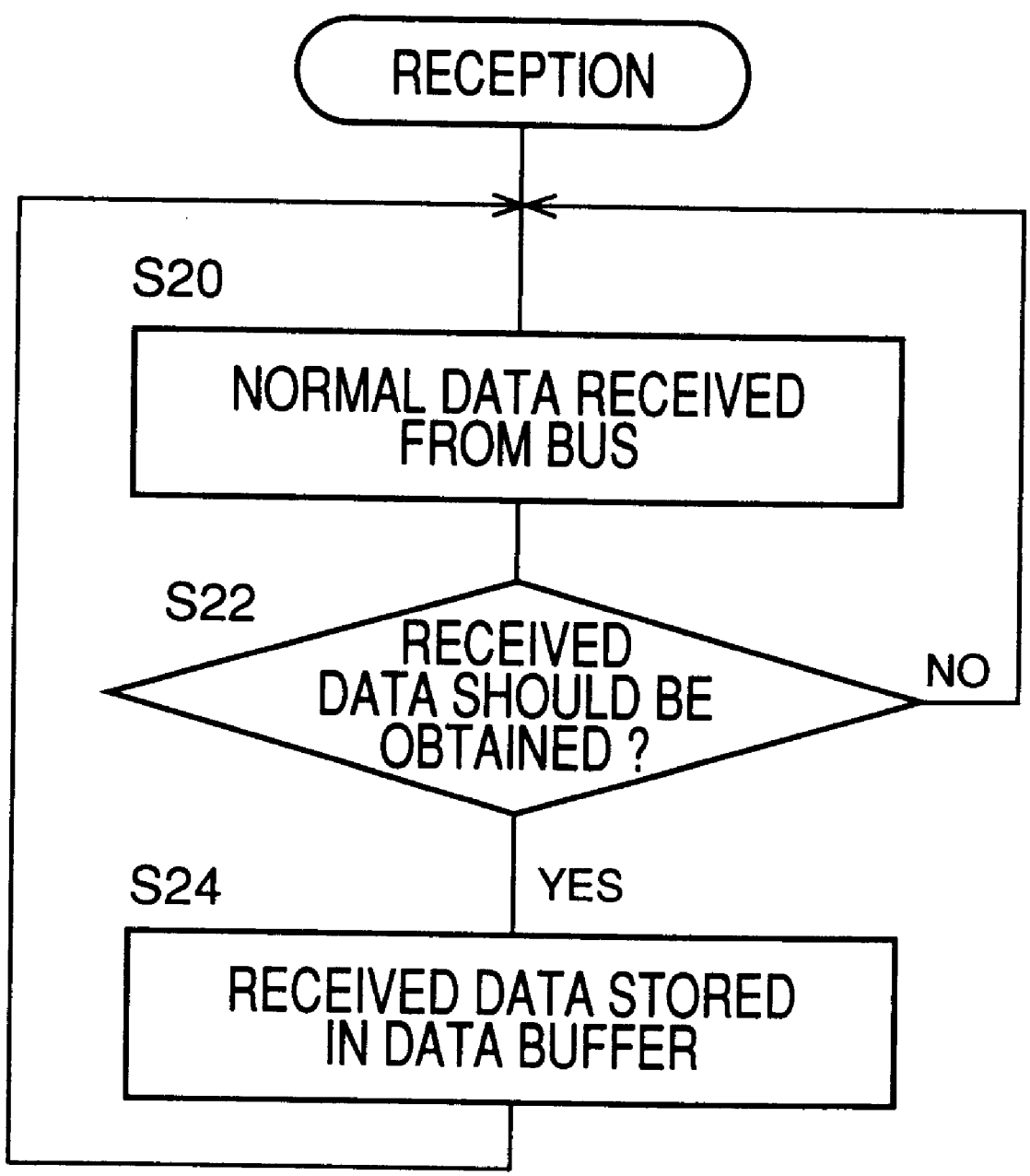
FIG. 11 is a flow chart representing an operation of a receiver as a node in the M/C and SFU communication networks.

FIGS. 10 and 11 are flow charts representing one example of the method for carrying out the above described self controls (1) and (2). FIG. 10 is a flow chart representing an operation carried out by a transmitter node, and FIG. 11 is a flow chart representing an operation carried out by a receiver node. In this connection, the term "transmitter" is used for indicating a node which has data to be transmitted, and the term "receiver" is used for indicating a node which is to receive the data transmitted from the transmitter. Thus, the transmitter and receiver nodes are not different from each other in themselves.

First, the operation carried out by the transmitter node is described briefly by reference to FIG. 10. Initially, at Step S10, each node identifies whether there is any carrier on the communication line. This is carried out by detecting changes of the voltage of the signal line. If the detected voltage changes indicate that there is no carrier on the signal line, each node judges that it can transmit data, that is, make a positive judgment. Hence, the control goes to Step S12 to transmit data to the communication line. The transmitter node continues to monitor the data indicated by the carrier on the communication line, throughout a time period in which it transmits data. When the node has finished the data transmission, the control goes to Step S14 to judge whether the data transmitted thereby are the same as the data indicated by the carrier on the line during the above time period. If yes, the transmitter node concludes that the data transmission is normal, that is, makes a positive judgment, and quits the program of FIG. 10. On the other hand, if a negative judgment is made at Step S14, the control goes to Step S16 to revoke the transmitted data. This is done by transmitting data ("revoke data") to command revocation of the transmitted data. The revoke data are received by each of the nodes, so that each node revokes or discards the data received immediately before the revoke data.

Next, the operation carried out by the receiver node is described briefly by reference to FIG. 11. Basically, each of the nodes receives the carrier on the communication line. Here, the receiver node is defined as one which knows that the carrier on the line is not the carrier transmitted by itself. Initially, at Step S20, each node receives normal data which are not followed by any revoke data. Step S20 is followed by Step S22 to judge whether the received data have been directed to itself, based on the address included in the received data. If a positive judgment is made at Step S22, the control goes to Step S24 to obtain and store the received data in a data buffer and quits the control program. The data stored in the data buffer will be read out and used in subsequent processes. On the other hand, if a negative judgment is made at Step S22, the received data are not stored in the data buffer and discarded.

The operations represented by FIGS. 10 and 11 are just the basic steps extracted from the CSMA/CD method which include a number of additional steps including, e.g., the step of determining a waiting time for re-transmitting data after the data transmitted thereby collide with another data. However, those steps are not relevant to the present invention, and the description thereof is omitted.

As is apparent from the foregoing description, the M/C controller 516, the SFU controllers 530, and the F/D controllers 540 are connected to one another via the M/C network 520 which is essentially provided by the single communication line, and the SFU networks 534. Thus, the CC mounting apparatus 10 enjoys a simple construction, while maintaining the information transmitting capability.

It merges from the above description that each of the M/C, SFU, and F/D controllers 516, 530, 540 as the nodes should have its own address. This address will be referred to as the node ID data. It is assumed that the M/C controller 516 has MID data as its own node ID data, each of the SFU controllers 530 has SID data as its own node ID data, and each of the F/D controllers 540 has FID data as its own node ID data, as shown in FIG. 8. The respective sets of node ID data for all the controllers 516, 530, 540 are pre-stored in a memory device (not shown, e.g., PROM, EPROM, EEPROM, etc.) incorporated in each of the controllers 516, 530, 540. Therefore, each of the controllers 516, 530, 540 can communicate with any of the other controllers 516, 530, 540. This communication is supported by the M/S communication sections 552 and the S/M communication sections 130 which cooperate with each other to function as bridges for connecting the SFU networks 534 and the M/C network 520 to one another. In addition, the F/D controller 540 of each feeder 54 is connected to one SFU network 534 by the combination of the F/S communication section 270 thereof and one S/F communication section 116 which cooperate with each other to function as a bridge therefor. Moreover, each SFU controller 530 or each F/D controller 540 can communicate with the host computer 504 via the M/C controller 516 which functions as a so-called gateway.

Each feeder 54 should have its own feeder identification code. However, in the present embodiment, the set of FID data for each feeder 54 is also used as the set of own feeder identification code for the same 54. Therefore, in the present embodiment, the memory device (not shown) incorporated in each F/D controller 540 provides a holder which holds a set of own feeder identification code, or a memory which stores a set of own identification code. A feeder bar-code label 572 on which a bar code representing the set of FID data, i.e., the set of own feeder identification code is adhered to the side plate 198 of each feeder 54, as shown in FIG. 5.

As shown in FIG. 9, the SPID network 522 includes the light detector 290 of each of the M/S communication section 552s, and two electric wires 574 which cooperate with each other to connect the light detector 290 of each one of the M/S sections 552 to the M/C controller 516, independent of the light detector 290 of the other M/S section 552. That the light detector 290 of each one of the M/S sections 552 is connected to the M/C controller 516, independent of the light detector 290 of the other M/S section 552, means that the M/C controller 516 can judge whether or not the light emitter 280 of each one of the S/M communication sections 130 is emitting light, independent of whether or not the light emitter 280 of the other S/M section 130 is emitting light. Each FPID network 536 has a construction similar to that of the SPID network 522, that is, includes the light detector 290 of each of the S/F communication sections 116, and twenty-four electric wires 576 which cooperate with one another to connect the light detector 290 of each one of the S/F sections 116 to one SFU controller 530, independent of the light detectors 290 of the other S/F sections 116. Accordingly, the SFU controller 530 can judge whether or not the light emitter 280 of each one of the F/S communication sections 270 is emitting light, independent of whether or not the light emitters 280 of the other F/S sections 270 are emitting lights. The SPID network 522 includes the two electric wires 574 corresponding to the two combining devices 68, 552, and each of the two FPID networks 536 includes the twenty-four electric wires 576 corresponding to the twenty-four FHUs 100 of each of the two support cars 52.

Figure 12:
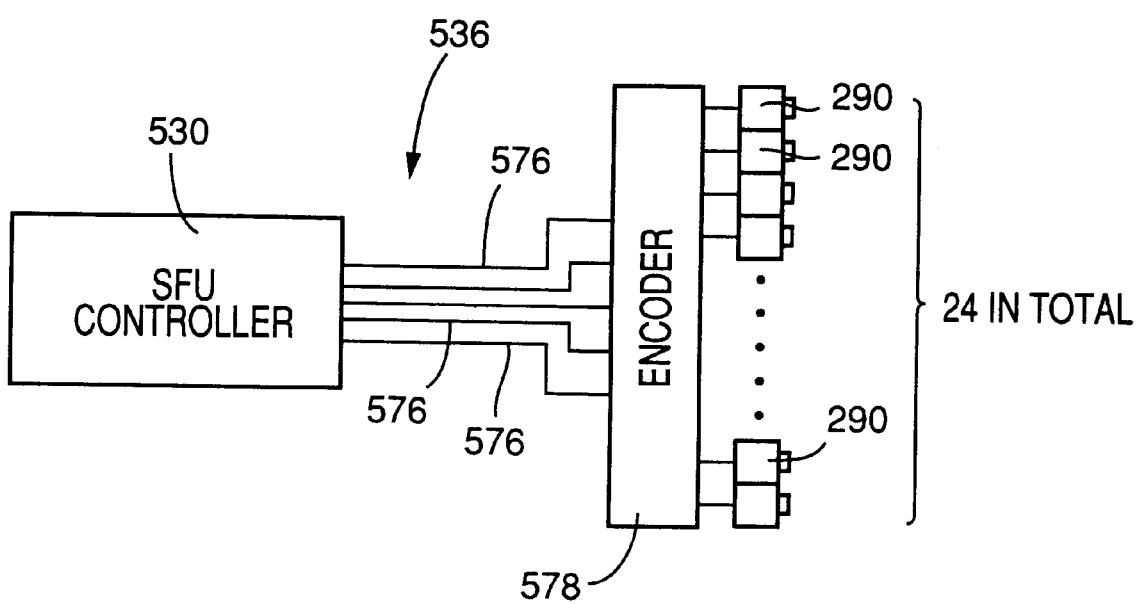
FIG. 12 is a block diagram of another FPID network which may be employed in place of an FPID network of the CC supplying apparatus of FIG. 1.

FIG. 12 shows a second embodiment of the present invention wherein a reduced number of electric wires 576 are employed for each FPID network 536. In the second embodiment, each FPID network 536 is equipped with an encoder 578. The encoder 578 has twenty-four input ports which are connected to the respective light detectors 290 of the twenty-four S/F communication sections 116 corresponding to at most the twenty-four feeders 24, and five output ports which are connected to five electric wires 576, respectively, each of which in turn is connected to the corresponding SFU controller 530. When any one of the respective light detectors 290 connected to the twenty-four input ports of the encoder 578 detects light, the encoder 578 generates a 5-bit binary number representing the position of the light detector 290 or the corresponding input port. Based on this binary number, the SFU controller 530 identifies the FHU 100 having the light detector 290 which has detected the light. The 5-bit binary numbers can represent thirty-two decimal numbers of 0 to 31 that are more than the number, 24, of the feeders 54 that can be held by one support car 52. Therefore, the five electric wires 576 suffice for the twenty-four feeders 54. However, as described later, the FPID network 536 is designed such that two or more light detectors cannot simultaneously detect lights. Since the five wires 576 suffice, the total length of the wires 576 needed in the second embodiment is much shorter than that of the wires 576 needed in the first embodiment shown in FIG. 9. If the encoder 578 is provided near the FHUs 100, the above length is further shortened. This advantage is amplified as the number of the FHUs 100 employed for one support car 52 increases. In the present embodiment, the rate of decreasing of the number of electric wires 576 is 5/24. In the case where one hundred FHUs 100 are employed for one car 52, the rate is 7/100 (e.g., the output of the encoder 578 is 7 bits). Generally, the number, n, of wires 576 suffice for the number, $2^n$, of FHUs 100.

Next, there will be described the operation of the CC mounting system 500 constructed as described above.

Initially, the first procedure (1) is carried out.

Procedure (1): Pre-treatment

An operator inputs, to the host computer 504, a CC data base which includes sets of CC information about all the sorts of CCs to be mounted, and CC identification codes corresponding to all the sorts of CCs such that each of the sets of CC information is related to a corresponding one of the CC identification codes. The operator needs to prepare the CC data base in advance. Each set of CC information may include the position ("CC position") of each CC on the CC carrier tape 156, the CC accommodating pitch, the number of remaining CCs ("remaining-CC number"), etc., as described previously. FIG. 13 shows data table as an example of the CC data base. The first procedure (1) must be finished before the following procedures are carried out.

In the present embodiment, it is assumed that the control program which is carried out by the M/C controller 516 for controlling the operation of the X-Y-Z-θ moving device 26, the pressure of the air supplied to the suction nozzle 20, etc. is prepared by a programmer and is stored in advance in a memory (e.g., ROM) of the host computer 504. The control program is specific to each sort of PCB 16, and relates the name of each sort of CCs to be mounted on the PCB 16 of that sort, to the position or positions (i.e., X and Y coordinates) where the CC or CCs is/are mounted on the PCB 16. The name of each sort of CCs may be any name so long as it distinguished each sort of CCs from the other sorts of CCs; for example, the type of that sort of CCs, the abbreviated symbol of that sort of CCs used in circuit diagrams, or the like. For example, one sort of capacitors may be named as C1, and another sort of capacitors may be named as C2; one sort of resistors may be named as R1, and another sort of resistors may be named as R2; and one sort of integrated circuits may be named as IC1 and another sort of integrated circuits may be named as IC2. If the control programs are prepared using names of CCs which can easily be understood by a circuit designer and/or a programmer, the preparation thereof can be facilitated and the possible subsequent maintenance thereof (e.g., revision thereof) can easily be done.

Each control program as prepared by the programmer relates the name of each sort of CCs to a position or positions on a corresponding sort of PCB 16, but does not include any information about a position where that sort of CCs is supplied. However, this information is essentially needed for the M/C controller 516 to control the CC mounting operation. Accordingly, each control program as prepared by the programmer is not complete. To obtain the information about the position or positions where one or more sorts of CCs is or are supplied, the host computer 504 carries out a supply-position optimizing program. According to this program, the host computer 504 relates the position where each sort of CCs is supplied, to the CC identification code adhered to the CC-tape reel 150 in which that sort of CCs are stored, based on the above-described CC data base stored in the computer 504 and the position or positions defined by each control program where the CC or CCs of that sort is or are mounted on the PCB 16 of a corresponding sort. This program is so programmed as to optimize the position or positions where one or more sorts of CCs is or are supplied in such a sense that the optimized position or positions leads or lead to minimizing the time needed for mounting all CCs on the PCB 16 of each sort.

According to the supply-position optimizing program, the host computer 504 may determine the supply positions such that one sort of CCs are supplied from two or more feeders 54 to two or more CC-supply positions, often in those cases where a plurality of CCS of one sort are mounted on one PCB 16 and the CC-mount positions where those CCs are mounted on the PCB 16 are distant from each other. Generally, the time needed for mounting all CCs on one PCB 16 can be reduced by reducing the total distance over which the suction nozzle 20 is moved by the X-Y moving device 24 for mounting all the CCs on the PCB 16. The first result from the above distance reduction is that CCs are sequentially mounted at CC-mount positions which are near to each other and the second result is that one or more CC-mount positions where one or more CCs are mounted is or are near to a CC-supply position where the one or more CCs are supplied. That is, each CC-supply position where one or more CCs are supplied is determined depending upon the CC-mount positions where the one or more CCs are mounted on the PCB 16. Accordingly, for example, in the case where a plurality of CCs of one sort are mounted at a plurality of CC-mount positions which are distant from each other on one PCB 16, those CCs may be supplied from a plurality of feeders 54 which are near to the plurality of CC-mount positions, respectively. In this case, if two or more feeders 54 are held by two or more FHUs 1000, those feeders 54 may be held by either those FHUs 100 which are successive to each other or those FHUs 100 which are separate from each other. In this way, the total CC mounting time may be reduced as compared with the case where just a single feeder 54 is employed for supplying the CCs. This is true with the case where a so-called X-Y moving mounting machine such as the mounting machine 18 is employed. This is also true and more advantageous with the case where a so-called index-type mounting machine (e.g., the apparatus disclosed in Japanese Patent Application laid open for inspection under Publication No. 7-15179) is employed.

In the present embodiment, each feeder 54 can support one or two CC-tape reels 150 at one or two reel-support positions thereof. Therefore, according to the CC-supply-position optimizing program, the host computer 504 determines which one of the two reel-support positions of the each feeder 54 is to be taken by the one reel 150, or each of the two reels 150, supported thereby. The host computer can specify each CC-supply position where one or more CCs of a corresponding sort, by designating one of the two car-combine positions where a corresponding one support car 52 is combined with the CC mounting apparatus 10, one of the twenty-four feeder-hold positions where a corresponding one feeder 54 is held by the one car 52, and one of the two reel-support positions where a corresponding one reel 150 is supported by the one feeder 54. As a result of the optimization in accordance with the CC-supply-position optimizing program, the host computer 504 obtains, for the control program, the relationship in which each of the CC-supply positions is related to corresponding one or two CC identification codes (hereinafter, referred to as the CC-SP/CC-IC relationship). According to the thus obtained CC-SP/CC-IC relationship, the operator mounts one or two CC-tape reels 150 at a corresponding reel-support position or positions on each feeder 54, mounting one or more feeders 54 at a corresponding feeder-hold position or positions on each support car 52, and combining one or two support cars 52 at a corresponding car-combine position or positions on the CC mounting apparatus 10, in the second to fourth procedures (2) to (4) described later. This operation will be referred to as the "reel-and-feeder mounting and car combining operation". The present CC mounting system 500 can detect a possible error or errors with the reel-and-feeder mounting and car combining operation, and inform the operator of the error or errors, in a manner described, so that the operator can correct the error or errors, thereby completing the entire operation.

The host computer 504 transfers the control program including the above described CC-SP/CC-IC relationship, to the M/C controller 516 via the host network 510. According to this control program, the M/C controller 516 carries out the CC mounting operation, i.e., the operation for mounting the CCs on the PCB 16.

However, the programmer may prepare a control program which relates not the name of each sort of CCs but the CC-supply position or positions where one or more CCs of each sort is or are supplied, to one or more CC-mount positions where the one or more CCs are mounted on the PCB 16. In this case, the programmer prepares the control program by directly specifying the CC-supply position or positions, like in the case of preparing a control program for use in a conventional CC mounting system. That is, the CC-supply positions may be specified either indirectly using the above described CC-supply-position optimizing program, or directly by the programmer. In the latter case, too, the CC mounting system 500 can detect, according to the control program, one or more possible errors with the reel-and-feeder mounting and car combining operation which has been carried out by the operator and inform the operator of the detected error or errors.

Procedure (2): Mounting of CC-Tape Reels 150

One or two predetermined CC-tape reels 150 each of which holds CCs to be mounted on the PCB 16 are mounted or set at a predetermined reel-support position or positions on each feeder 54. When one reel 150 or each of two reels 150 is mounted on one feeder 54, the bar-code label 506 adhered to the one reel 150, or the respective labels 506 adhered to the two reels 150, and the bar-code label 572 adhered to the one feeder 54 are read in succession by a bar-code reader (not shown) which is connected to the LT computer 502, so that the computer 502 prepares data table, as shown in FIG. 14, which relates one or two CC identification codes corresponding to the one or two reels 150, to the feeder identification data (FID) corresponding to the one feeder 54. This table will be referred to as the CC-feeder table.

As shown in FIG. 8, an interface 600 is connected to the LT computer 502. The interface 600 is also connected to an interface 602 of each of the two support cars 52, via a corresponding router (not shown). The interface 602 of each car 52 is connected to the SFU network 534 of that car 52. Thus, each of the respective SFU networks 534 of the two cars 52 is connected to the LT computer 502, independent of the other SFU network 534. However, regarding a car 52 which has not been combined with the CC mounting apparatus 10, the interface 600 may be directly connected to the interface 602 of the car 52. Thus, the CC-feeder table shown in FIG. 14 can be transmitted from the LT computer 502 to each of the two SFU controllers 530. Each SFU controller 530 stores, in a memory (e.g., RAM) incorporated therein, the CC-feeder table received from the LT computer 502.

Therefore, in even a car 52 which has not been combined with the CC mounting apparatus 10, the SFU controller 530 of the car 52 can know, in advance, the relationship between the FID of each of the feeders 54 to be mounted on each of the two cars 52 including the car 52 itself and the CC identification code or codes of the one or two CC-tape reel or reels 150 amounted on the each feeder 54. This leads to improving the efficiency of the preparing operation as a whole. In the present embodiment, a portion of the LT computer 502 which stores the CC-feeder table, or the memory incorporated in each of the SFU controllers 530 provides a memory which stores the CC-feeder table.

The CC-feeder table shown in FIG. 14 can indicate, corresponding to each FID, two CC identification codes since each feeder 54 can support at most two CC-tape reels 150. Those two CC identification codes will be referred to as the CC code 1 and the CC code 2, respectively. In the present embodiment, the CC code 1 is assigned for the CCs supplied by the drive device 200 of each feeder 54, and the CC code 2 is assigned for the CCs supplied by the drive device 201 of the same 54. The bar-code label 506 adhered to one CC-tape reel 150 mounted at the reel-support position corresponding to the drive device 200 should be first read, and the bar-code label 506 adhered to the other reel 150 mounted at the reel-support position corresponding to the drive device 201 should be then read. If the order of reading of the respective bar-code labels 506 of the two two reels 150 is not correct, the CC-feeder table prepared by the LT computer 502 is corrected by re-reading, using the bar-code reader, the bar-code labels 506 of the two reels 150 in the correct order, or by being directly changed on a display of the LT computer 502.

Procedure (3): Mounting of Feeders 54

Each of the feeders 54 which have passed the above described procedure (2) is mounted on a predetermined FHU 100 of a predetermined support car 52. The respective positions of the feeders 54 mounted on the feeder holding device 64 of each car 52, relate to the order of supplying of CCs, that is, the order of mounting of CCs and accordingly greatly influence the time needed for mounting CCs on each PCB 16. Therefore, as described above, the feeders 54 are mounted on the predetermined FHUs 100, respectively. The operator must do this. The SFU controller 530 can judge whether each feeder 54 has been correctly mounted or set on the predetermined FHU 100 by the operator, in a manner described later. The result of this judgment is displayed on the display of the LT computer 502, or a display (not shown) provided on each car 52. Based on the result indicated on the display, the operator can move the feeder or feeders 54 from the incorrect FHUs 100, onto the correct FHUs 100. The result of this correction is also displayed.

In a conventional CC mounting system, a CC mounting apparatus thereof carries out a CC mounting operation, by utilizing not the respective positions of feeders actually mounted on predetermined FHUs, but the respective positions of predetermined FHUs. Therefore, if an operator mounts the feeders on incorrect FHUs, then incorrect CCs are mounted on a PCB. In the present embodiment, too, it is preferred that the feeders 54 be mounted on the predetermined FHUs 100, respectively. However, this is not essentially required in the present CC mounting system 500. In case one or more feeders 54 are mounted on incorrect FHUs 100, the present system 500 can correctly mount CCs on each PCB 16. Accordingly, if the feeder mounting error does not greatly increase the CC mounting time, the feeders 54 mounted on the incorrect FHUs 100 need not be corrected.

Procedure (4): Combination of CC Mounting Apparatus 10 and Support Cars 52

The two CC supplying apparatus 8 (i.e., the two support cars 52) are combined with the CC mounting apparatus 10. The M/C controller 516 can judge whether each of the two cars 52 has been combined at the predetermined car-combine position with the mounting apparatus 10, in a manner described later. The result of this judgment is displayed on a display (not shown) provided on the mounting apparatus 10. If the display indicates that the car 52 in question has been combined at an incorrect position with the mounting apparatus 10, the operator can move the car 52 from the incorrect position to the correct position where the car 52 is combined with the mounting apparatus 10. However, the M/C controller 516 can carry out the CC mounting operation, without requiring the operator to do this correction, for the reason which will be described later.

The procedures (3) and (4) may be carried out in the order of description, or in the reversed order. Otherwise, one of the two procedures (3), (4) may be carried out while the other procedure is being done.

Procedure (5): Preparation of Support Car-Combining Device Table

Figure 15:
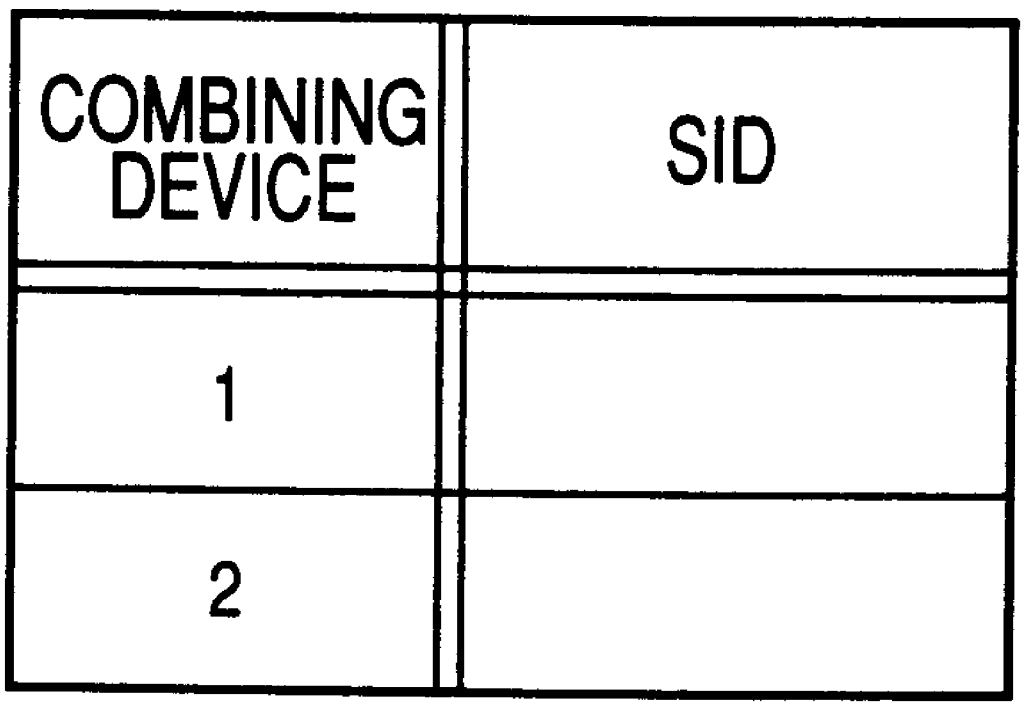
FIG. 15 is a support car-combining device table which is prepared by an M/C controller of the CC mounting apparatus of FIG. 1.

The M/C controller 516 prepares a support car-combining device table, as shown in FIG. 15, which indicates whether each of the two combining devices is in use or not and with which support car 52 one combining device in use or each of the two combining devices in use is combined. This table may be prepared by utilizing the SPID network 522, in the following manner: First, when one car 52 is combined with one combining device of the CC mounting apparatus 10, the electric power is supplied from the apparatus 10 to the car 52, and the SFU controller 530 of the car 52 transmits a signal indicating that the controller 530 is in use, to the M/C controller 516. Second, the M/C controller 516 transmits, to that car 52, a command including the own SID of that SFU controller 530. The command commands the SFU controller 530 to control the light emitter 280 of the S/M communication section 130 to emit light. Third, the SFU controller 530 which has received the command controls the light emitter 280 of the S/M section 130 to emit light. Fourth, the M/C controller 516 scans the respective current states of the respective M/S communication sections 552 of the two combining devices, specifies one of the two M/S sections 552 which includes the light detector 290 which has detected the light, and determines one of the two combining devices which corresponds to the specified M/S section 552, as one with which the car 52 including the SFU controller 530 in question has been combined with the CC mounting apparatus 10. This can be done because each of the respective light detectors 290 of the two combining devices is connected to the M/C controller 516, independent of the other light detector 290. Based on the thus obtained results, the M/C controller 516 prepares the support car-combining device table shown in FIG. 15.

Alternatively, the support car-combining device table shown in FIG. 15 may be prepared in the following manners: First, the M/C controller 516 periodically outputs a command to the M/C network 520. Each of the commands includes the own SID of the SFU controller 530 of a corresponding one of the support cars 52 which are to be combined with the CC mounting apparatus 10. The remaining content of each command is the same as that employed in the above described manner, that is, commands the corresponding SFU controller 530 to control the light emitter 280 of the S/M communication section 130 to emit light. Second, if this command is received by the SFU controller 530 of one car or each of two cars 52 which has or have been combined with the apparatus 10, the SFU controller 530 judges whether the SID included in the received command is identical with the own SID thereof. If yes, the SFU controller 530 controls the light emitter 280 of the S/M communication section 130 to emit light. However, in the case where no car 52 that includes the SFU controller 530 which may make the positive ("yes") judgment has been combined with the apparatus 10, nothing occurs. Third, the M/C controller 516 scans the respective states of the respective light detectors 290 of the two M/C sections 552 corresponding to the two combining devices. If the light detector 290 of either one, or each, of the two M/S sections 552 detects light, the M/S controller 516 determines that with one of the combining devices which corresponds to the M/S section 552 including the one or each light detector 290, one of the cars 52 which includes the SFU controller 530 to which the command has been transmitted just before the detection of the light by the one or each light detector 290, has been combined with the apparatus 10.

Procedure (6): Preparation of Feeder-FHU Table

Figure 16:
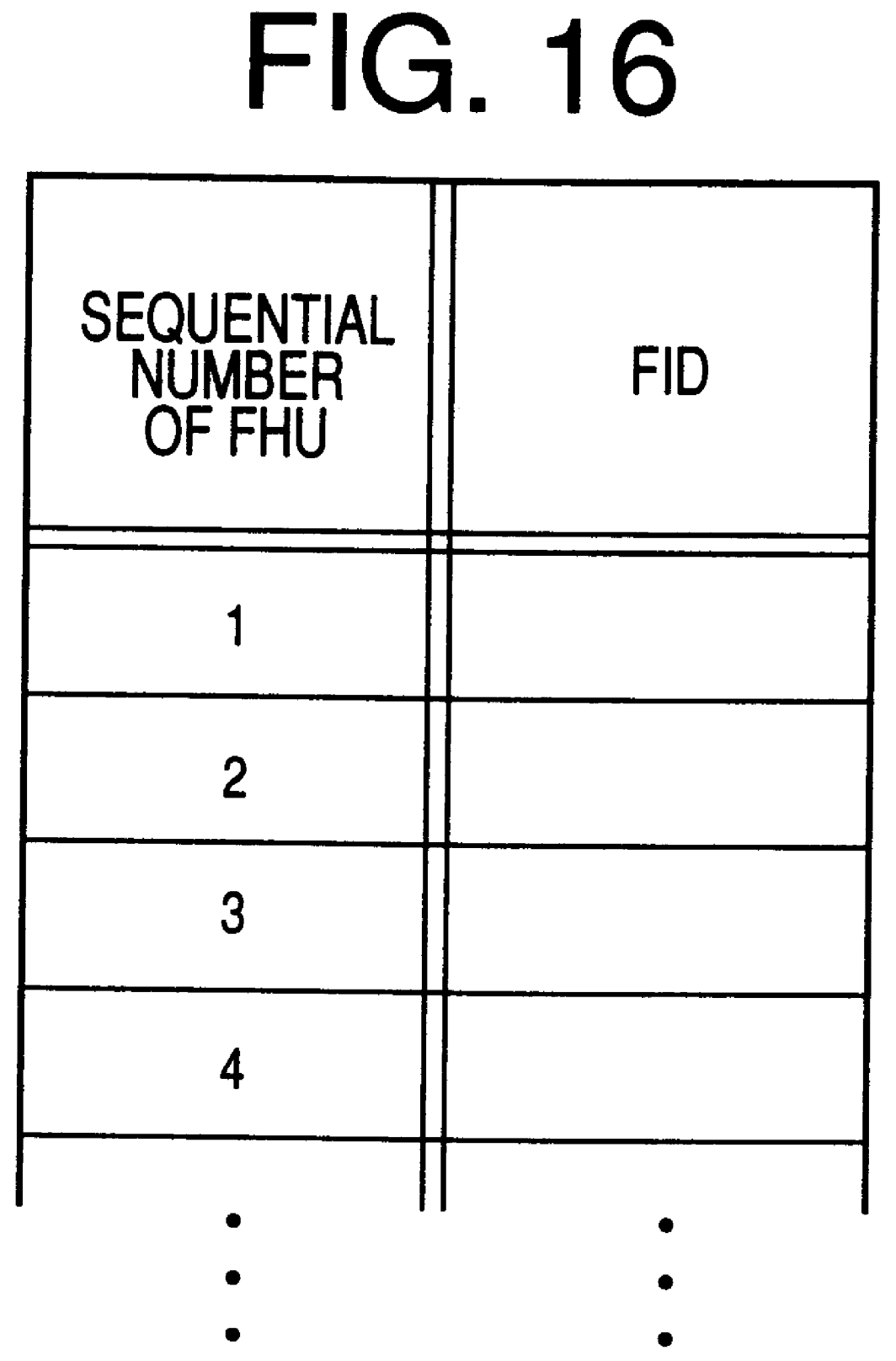

Each of the SFU controllers 530 prepares a feeder-FHU table as shown in FIG. 16. This table indicates the respective positions where at most twenty-four feeders 54 are held by the twenty-four FHUs 100 of a corresponding support table 52, that is, by which one of the twenty-four FHUs 100 each of the feeders 54 is held. This table is prepared by using a corresponding FPID network 536. This table can be prepared in the same manner as either one of the two alternative manners which have been described in Procedure (5) as those which can be employed for preparing the support car-combining device table shown in FIG. 15. However, the amount of data contained in the feeder-FHU table would probably be larger than that contained in the support car-combining device table, because the maximum number of feeders 54 that can be held by each car 52 is greater the maximum number of cars 52 that can be combined with the CC mounting apparatus 10. The feeder-FHU table is prepared by using the FPID network 536, and the support car-combining device table is prepared by using the SPID network 522. In each case, the respective positions of a plurality of objective elements, that is, the feeders 54 or the cars 52, can be identified or specified with reliability, although the greatest possible number of feeders 54 may be different from that of cars 54.

Procedure (7): Preparation of CC-FHU Table

The LT computer 502 is connected to the SFU network 534 of each of the two support cars 52, using the interface 600 and a corresponding of the two interfaces 602 (and a corresponding one of the routers), so that the CC-feeder table (FIG. 14) prepared in Procedure (2) are sent a corresponding one of the two SFU controllers 530. The LT computer 502 as connected to each SFU network 534 functions as a node of the SFU network 534, and has its own address different from those of the other nodes of the same 534. Each SFU controller 530 has a memory which stores the CC-feeder table (FIG. 14) received from the LT computer 502, and the own feeder-FHU table (FIG. 16) of a corresponding car 52 prepared in Procedure (6), and prepares, based on the data stored in that memory, a CC-FHU table shown in FIG. 17. Each of the CC-feeder table and each feeder-FHU table commonly contains one or more sets of FID data, and the one or two sorts of CCs and the FHU 100 which correspond to each set of FID are related to each other so as to provide the CC-FHU table. This table indicates which sort of CCs is supplied from which FHU 100, i.e., which supply position.

Procedure (8): Preparation of CC-Remaining Number Table

Each of the two SFU controllers 530 transmits a corresponding CC-FHU table prepared in Procedure (7), to the M/C controller 516. The M/C controller 516 prepares a CC-remaining number table as shown in FIG. 18, for each of the two support cars 52, based on a corresponding one of the two CC-FHU tables (FIG. 17) received from the two SFU controllers 530, and the CC data base (FIG. 13) stored in the host computer 504. The M/C controller 516 obtains the CC data base from the host computer 504 via the host network 510. However, the M/C controller 516 does not obtain all the CC data base, but obtains only the sets of CC data corresponding to the sets of CC identification codes contained in the two CC-FHU tables from the two SFU controllers 530. Thus, the time needed for the M/C controller 516 to communicate with the host computer 504 for obtaining the CC data base therefrom is reduced, and the CC-remaining number table is efficiently prepared. However, in the case where the M/C controller 516 has a memory which has a sufficiently large capacity, it may be adapted to obtain all the CC data base in each case.

Thus, the M/C controller 516 can know, based on the CC-remaining number table of FIG. 18 and the support car-combining device table of FIG. 15, all the sorts of CCs to be mounted on the PCB 16 and the respective positions (i.e., supply positions) of the FHUs 100 which hold the feeders 54 which supply those sorts of CCs. In addition, the M/C controller 516 can know the number ("1" or "2") indicative of the reel-support position where the CC-tape reel 150 corresponding to each sort of CCs is supported by a corresponding feeder 54, and the number indicative of the CCs remaining in the CC-tape reel 150 corresponding to each sort of CCs. Based on those data, the M/C controller 516 controls the mounting machine 18. More specifically described, based on the CC-accommodating position indicative of the position where each CC is accommodated in the CC accommodating pocket of the CC carrier tape 156, the suction nozzle 20 is moved to a suction position where the nozzle 20 sucks the CC from the tape 156. In addition, the M/C controller 516 transmits each of the two CC-remaining number tables prepared for the two support cars 52, to a corresponding one of the two SFU controllers 530. Each SFU controller 530 changes or updates the remaining-CC numbers in the CC-remaining number table, during the CC mounting operation, in the manner described later.

Procedure (9): Informed of CC-Accommodating Pitches and Remaining-CC Numbers

Each feeder 54 is equipped with various switches as described previously, and one or more of those switches can be operated for inputting a rotating pitch of the electric motor 202, 226 at which the motor 202, 206 is rotated for supplying each CC. The rotating pitch corresponds to the CC accommodating pitch. Based on the information input by the operator, the F/D controller 540 can control the motor 202, 206. That is, the F/D controller 540 can control, by itself, the corresponding feeder 54, and additionally can be informed of the CC-accommodating pitch or pitches and the remaining CC number or numbers by the corresponding SFU controller. The user can freely select one of the two control manners. In the case where the latter control manner is selected by the user, each SFU controller 530 informs, based on the corresponding CC-remaining number table received from the M/C controller 516 in Procedure (8), each of the respective feeders 54 held on the corresponding support car 52, of the corresponding CC-accommodating pitch or pitches and the corresponding remaining-CC number or numbers. The F/D controller 540 of each feeder 54 stores the received data as a pitch-remaining number table as shown in FIG. 19. Therefore, each F/D controller 540 can determine, based on the data received from the M/C controller 516, the pitch of feeding of one or each CC carrier tape 516, i.e., the rotating pitch of one or each motor 202, 226 corresponding to the CC accommodating pitch, and monitor the number of the CCs remaining on each CC carrier tape 156. In the present embodiment, in the case where the CC-remaining number table is received from the M/C controller 516 and is stored in each F/D controller 540, only the table is used even if data may be input through the operation of the switches of each feeder 54.

Each of at most two remaining-CC numbers in the pitch-remaining number table is decremented by one each time one CC of a corresponding sort is supplied from the feeder 54. The at most two remaining-CC numbers may be indicated on two seven-digit LED (light emitting diode) displays or LCDs (liquid crystal displays) provided on the feeder 54, respectively. Alternatively, each feeder 54 may be equipped with a mechanically countable display which can be controlled by the F/D controller 540, or an LCD display which consumes a low electric power and which operates on a storage battery so as to indicate the number or numbers of CCs remaining on one or two CC-carrier tapes 156 set in the feeder 54 even while the feeder 54 may not be supplied with any electric power. The F/D controller 540 may employ a non-volatile memory, such as EEPROM, for storing the CC-remaining number table. In this case, even in a state in which each feeder 54 is separate from a corresponding support car 52, or that car 52 is separate from the CC mounting apparatus 10, the LT computer 502 can read the number of each sort of CCs remaining in the feeder 54, and display the remaining-CC number or numbers on the display thereof, so that the user may utilize it or them.

The preparing operation ends with Procedure (9). It is preferred that Procedures (6) to (9) be carried out after all the feeders 54 are held on the two support cars 52 and both of the two cars 52 are combined with the CC mounting apparatus 10, because in this case the respective tables shown in FIGS. 14 to 19 are prepared all at once. However, this is not essentially required. In the case where those tables need updating, Procedures (6) to (9) may be repeated two or more times.

It emerges from the foregoing description that the present CC mounting system 500 prepares the support car-combining device table and the two feeder-FHU tables after the previously described reel-and-feeder mounting and car combining operation. Therefore, the mounting system 500 can detect one or more errors with the reel-and-feeder mounting and car combining operation, by comparing the prepared tables with the supply position-CC identification code relationship as a reference. The system 500 informs the operator by indicating, on a display (not shown) provided on the CC mounting apparatus 10, whether any errors have occurred and identifying what kind or kinds of errors have occurred. This indication may be carried out on a display provided on the host computer 504 or each of the cars 52. Thus, the system 500 can suggest the operator to correct the error or errors which have occurred to the reel-and-feeder mounting and car combining operation.

However, the present CC mounting system 500 may modify, based on the thus identified error or errors, the CC-mounting control program itself as if there had been no error with the reel-and-feeder mounting and car combining operation. More specifically described, the CC-mounting control program is rewritten to define the supply position-CC identification code relationship as modified based on the support car-combining device table and the feeder-FHU tables. This rewriting of the control program may be carried out in a fully automatic manner, or may be carried out only when a rewriting commanding member provided on the apparatus 10 is operated by the operator in response to the displaying of the error or errors with the reel-and-feeder mounting and car combining operation. In either case, the CC mounting system 500 can carry out the CC mounting operation, without needing any correcting work of the operator. In the case where it is required that all the sorts of CCs to be mounted on the PCB 16 can be supplied from the cars 52 but it is not minded that it takes a long time to mount the CCs on the PCB 16, it does not matter that there has occurred any error with the reel-and-feeder mounting and car combining operation.

The above explanation is particularly true with a CC mounting device such as the CC mounting apparatus 10 in which the suction nozzle 20 is moved by the X-Y moving device 24 so as to receive the CCs, one by one, from the CC supplying apparatus 8 and mount the CCs, one by one, on the PCB 16. However, it is true to some degree with other sorts of CC mounting devices such as a CC mounting device (disclosed in, e.g., the above-identified Japanese Patent Document 7-15179) which includes a plurality of CC holding devices which are rotated about a common axis line and each of which receives CCs from a CC supplying device at a CC receiving position provided on the locus of rotation thereof. In the latter case, however, it is common that respective feeder-hold positions where feeders are held by feeder-holding devices are so determined as to minimize the sum of the respective distances of movement of the feeder-holding devices needed for supplying CCs and, if one or more feeders are not held by predetermined feeder-holding devices, i.e., at predetermined positions, the CC mounting time is increased. If this time increase is excessive, it is preferred that the feeder or feeders held at the incorrect positions be moved to the correct positions.

Next, there will be described the exchange of information among the controllers 516, 530, 540 during the CC mounting operation. The M/C controller 516 stores the CC mounting control program as described above. The control program includes commands which command the controller 516 to carry out the CC mounting operation based on the above described supply position-CC identification code relationship.

First, the M/C controller 516 controls the mounting machine 18 or the suction nozzle 20 to suck up a CC, while supplying a supply command to the feeder 54 which supplies the CC to be sucked by the nozzle 20. This command includes the own CC identification code of the CC-tape reel 150 which stores the CC to be sucked by the nozzle 20. Although each feeder 54 can support at most two reels 150, the CC identification code of the supply command identifies which one of the two reels 150 should supply a CC. Second, the F/D controller 540 of the feeder 54 operates, based on the CC identification code of the supply command received, a corresponding one of the two drive devices 200, 201 to feed the CC-carrier tape 156 so that one CC is ready for being sucked by the nozzle 20. Third, the F/D controller 540 transmits information to the corresponding SFU controller 530 to inform that the feeder 54 has supplied one CC. This information includes the own CC identification code of the reel 150 which has supplied the CC. Fourth, each SFU controller 530 updates the CC-remaining number table stored therein, based on the information supplied from each of the F/D controllers 540.

Thus, during the CC mounting operation, each SFU controller 530 can follow the variable number or numbers of one or two sorts of CCS remaining in each of the feeders 54 held by a corresponding support car 52. In addition, the CC-remaining number table stored in the SFU controller 530 of each car 52 can be sent, at any timing, by the SFU controller 530 to the LT computer 502 via the interfaces 600, 602. The LT computer 502 can indicate, based on the table received, the current situation of the CCs on the display thereof, so that the operator can read it during the CC mounting operation.

Meanwhile, each SFU controller 530 can send the CC-remaining number table to the M/C controller 516 via the M/C network 520, and the M/C controller 516 can send the table to the host computer 504 via the host network 510. Based on the table received, the host computer 504 can update the remaining-CC numbers in the CC data base stored therein, during the CC mounting operation. In the case where a plurality of CC mounting apparatus 10 are connected to the host network 510, the host computer 504 can likewise update the remaining-CC numbers in the CC data base of each of the mounting apparatus 10, while the CC mounting operation is carried out by that apparatus 10. Each of the two cars 52, the CC mounting apparatus 10, or the host computer 504 can indicate, on the display thereof, every kind of information that has been obtained in the above described communication.

As is apparent from the foregoing description, in the present embodiment, a CC-supply managing device is provided by the LT computer 502, the host computer 504, the host network 510, the M/C controller 516, the M/C network 520, the SPID network 522, the SFU controllers 530, the SFU networks 534, the FPID networks 536, the F/D controllers 540, etc.; a feeder-holding-portion identifying device is provided by each of the SFU controllers 530, the corresponding SFU network 534, the corresponding FPID network 536, the corresponding F/D controllers 540, etc.; a control device is provided by each of the SFU controllers 530, the corresponding F/D controllers 540, etc.; and a CC identifying device is provided by each of the SFU controllers 530.

In the present CC mounting system 500, each of the feeders 54 has its own feeder identification code, i.e., FID data, which can easily be related to one or two own CC identification codes corresponding to one or two CC-tape reels 150 which is or are set in that feeder 54. That is, the CC-feeder table shown in FIG. 14 can be obtained in an easy manner in which the feeder bar-code label 572 adhered to each feeder 54 and the CC bar-code label or labels 506 adhered to one or two CC-tape reels 150 set in that feeder 54 are successively read using the bar-code reader. This CC-feeder table is utilized for managing the supplying of CCs, as described previously.

The present CC mounting system 500 can manage not only the feeders 54 which are currently used in the CC mounting operation but also the feeders 54 which are not, since each of all the feeders 54 has its own feeder identification code, FID data. For example, a production planning can be carried out with ease based on (1) the correspondence relationship between the respective own identification codes of the feeders 54 in use in the CC mounting operation, and the respective own CC identification codes of the CC-tape reels 150 set in those feeders 54; (2) the correspondence relationship between the respective own identification codes of the feeders 54 which wait for use in the CC mounting operation, and the respective own CC identification codes of the CC-tape reels 150 set in those feeders 54; (3) the respective own identification codes of the feeders 54 which wait for use in the CC mounting operation but does not have any CC-tape reels 150 set therein; the respective own CC codes of the CC-tape reels 150 which have not been set in any feeders 54; the correspondence relationship between the respective own identification codes of the feeders 54 which wait for use in the CC mounting operation but does not have any CC-tape reels 150 set therein, and the respective own CC identification codes of the CC-tape reels 150 which may possibly be set in those feeders 54; (6) places in a factory where the feeders 54 and/or the reels 150 raised in each item (1) to (4) are present, and the like. Thus, the present CC mounting system 500 can provide various sorts of information about the current situations of the feeders 54 and the reels 150. If there are feeders 54 which already hold the CC-tape reels 150 needed for carrying out a CC mounting operation on a new PCB 16, the operator can know the places where those feeders 54 are kept and, if there are no such feeders 54, the operator can know whether there are any feeders 54 which can hold those reels 150, and/or the places where those feeders 54 are kept. In contrast, if the feeders 54 do not have their own feeder identification codes, it is not possible to identify one or more feeders 54 which wait for use in a CC mounting operation but do not have any CC-tape reels 150 set therein. Therefore, it is not possible to manage the places where those feeders 54 are kept in a factory. If a production planning is carried out using the feeder identification codes, it costs high and needs a number of feeder identification codes for each support car 52. However, the number of the feeder identification codes needed is much smaller than that of the sorts of the CCs which may possibly be mounted on the PCBs 16. Therefore, the efficiency of the CC mounting operation can be maintained as a whole. Meanwhile, when CC mounting operations are carried out on different sorts of PCBs 16, respectively, those operations are interrupted by a pause in which some CC-tape reels 150 may be replaced with new ones 150 on some feeders 54, as needed. The production planning may be made in such a manner that the number of replacing of the reels 150 on the feeders 54 is minimized.

In the present CC mounting system 500, each support car 52 has the single SFU controller 530 as shown in FIG. 8. However, each car 52 may be equipped with two or more SFU controllers 530. In the latter case, the system 500 may be equipped with one or more additional M/C networks 520, M/S communication sections 552, S/M communication sections 130, SFU networks 534, FPID networks 536, etc. The two or more SFU controllers 530 are connected to different groups of FHUs 100, respectively. For example, in the case where each car 52 is equipped with two SFU controllers 530, one of the two controllers 530 may be connected to the first and second FHU groups 102 and the other controller 530 may be connected to the third and fourth FHU groups 102. In the case where each car 52 is equipped with four SFU controllers 530, the four controllers 530 may be connected to the first to fourth FHU groups 102, respectively, each of which consists of six FHUs 100. Since the number of the feeders 54 each SFU controller 530 manages decreases in the above cases, that controller 530 enjoys a more smooth communication traffic on the corresponding SFU network 534. Thus, the speed of information or data communication is increased, and the efficiency of the CC mounting operation is improved. This effect becomes more advantageous as the frequency at which the suction nozzle 20 sucks CCs increases.

In the present embodiment, each support car 52 can be combined at either one of the two combining positions (i.e., through either one of the two combining devices) with the CC mounting apparatus 10. Therefore, the CC mounting system 500 operates for identifying, using the SPID network 522, at which combining position each car 52 has been combined with the apparatus 10. However, in the case where each car 52 can be combined at only a predetermined one of the two combining positions with the apparatus 10, or in the case where the operator inputs, to the system 500, data indicative of at which position each car 52 has been combined with the apparatus 10, the SPID network 522, or the combining-position identifying means including the network 522 may be omitted.

Figure 20:
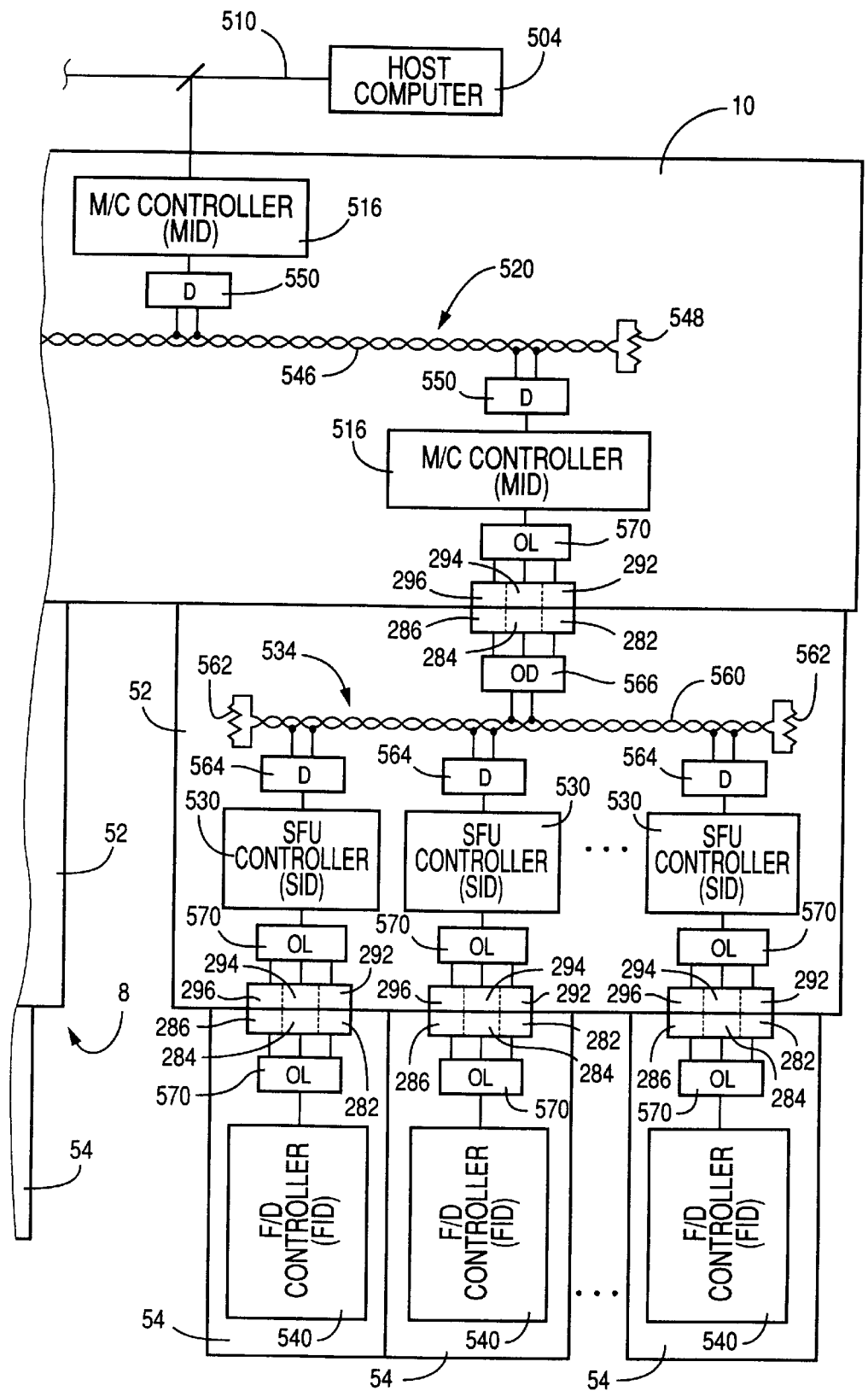
FIG. 20 is a diagrammatic view of a CC mounting system as a second embodiment of the present invention.

Referring next to FIG. 19, there will be described the second embodiment of the present invention. The second embodiment also relates to a CC mounting system including a CC supplying system. The CC supplying system of the second embodiment includes a CC mounting apparatus 10 and two support cars 52, like the CC supplying system of the first embodiment. However, the CC mounting apparatus 10 of the second embodiment is not equipped with the SPID network 522 that is employed in the first embodiment, and each car 52 is not equipped with the FPID network 536. Although the second embodiment shown in FIG. 20 does not include the LT computer 502, or the interfaces 600, 602 for connecting between the LT computer 502 and the SFU networks 534, unlike the first embodiment, the second embodiment may include those elements like the first embodiment. In the second embodiment, the CC mounting apparatus 10 includes three M/C controllers 516, two of which are shown in FIG. 20. One of the three M/C controllers 516 is connected to the host network 510, and is connected to the M/C network 520 independent of its connection to the host network 510. Each of the other two M/C controllers 516 is connected to the M/C network 520 only. The former one M/C controller 516 will be referred to as the first M/C controller 516 and each of the latter two M/C controllers 516 will be referred to as the second M/C controller 516.

Like the M/C controller 516 of the first embodiment, the first M/C controller 516 of the second embodiment controls the PCB conveying device 14 and the CC mounting machine 18. However, the two second M/C controllers 516 of the second embodiment are used exclusively for information communication with the two support cars 52, respectively. Each of the two second M/C controllers 516 is connected to a corresponding one of the two M/S communication sections 552, each of which need not include the light detector 290 in the present embodiment. Each of the support cars 52 is equipped with twenty-four SFU controllers 530 which are connected to the common SFU network 534 and each of which is connected to a corresponding one of the twenty-four S/F communication sections 116, each of which need not include the light detector 290 in the present embodiment. The SFU network 534 includes the S/M communication section 280, which need not include the light emitter 280 in the present embodiment. Each of the feeders 54 is equipped with the F/D controller 540 connected to the F/S communication section 270, which need not include the light emitter 280 in the present embodiment.

The three M/C controllers 516, the twenty-four SFU controllers 530, and the F/D controllers 540 are equipped with their own address data, that is, MID data, SID data, and FID data, respectively, like in the first embodiment. In the present embodiment, the three M/C controllers 516 have their predetermined positions in the CC mounting apparatus 10. The twenty-four controllers 530 have their predetermined positions in each support car 52. The first M/C controller 516 pre-stores information indicative of the respective positions where the twenty-four SFU controllers 530 each of which has its own address data, SID data, as its own node ID are disposed. Based on this information, the first M/C controller 516 can identify the position where a feeder 54 which supplies a certain sort of CCs is held on each car 52. That is, the SPID network 522 and the FPID network 536 employed as the position identifying means in the first embodiment is not employed in the second embodiment, but the increased numbers of M/C controllers 516 and SFU controllers 530 are employed in the second embodiment so as to provide the position identifying means which utilizes the respective sets of own node ID data of those controllers 516, 530. In the second embodiment, the respective constructions of the CC mounting apparatus 10 and the support cars 52 tend to be complex, but the position where each feeder 54 is held on each car 52 can be identified in a simpler manner.

In the CC mounting system 500 shown in FIG. 8, the combining position where each support car 52 is combined with the CC mounting apparatus 10 and the holding position where each feeder 54 is held by one car 52 can be identified using the SPID network 522 and the FPID networks 536. In the CC mounting system shown in FIG. 20, those positions can be identified using the increased numbers of M/C controllers 516 and SFU controllers 530 in place of the networks 522, 536. However, those positions may be identified in a different manner.

Figure 21:
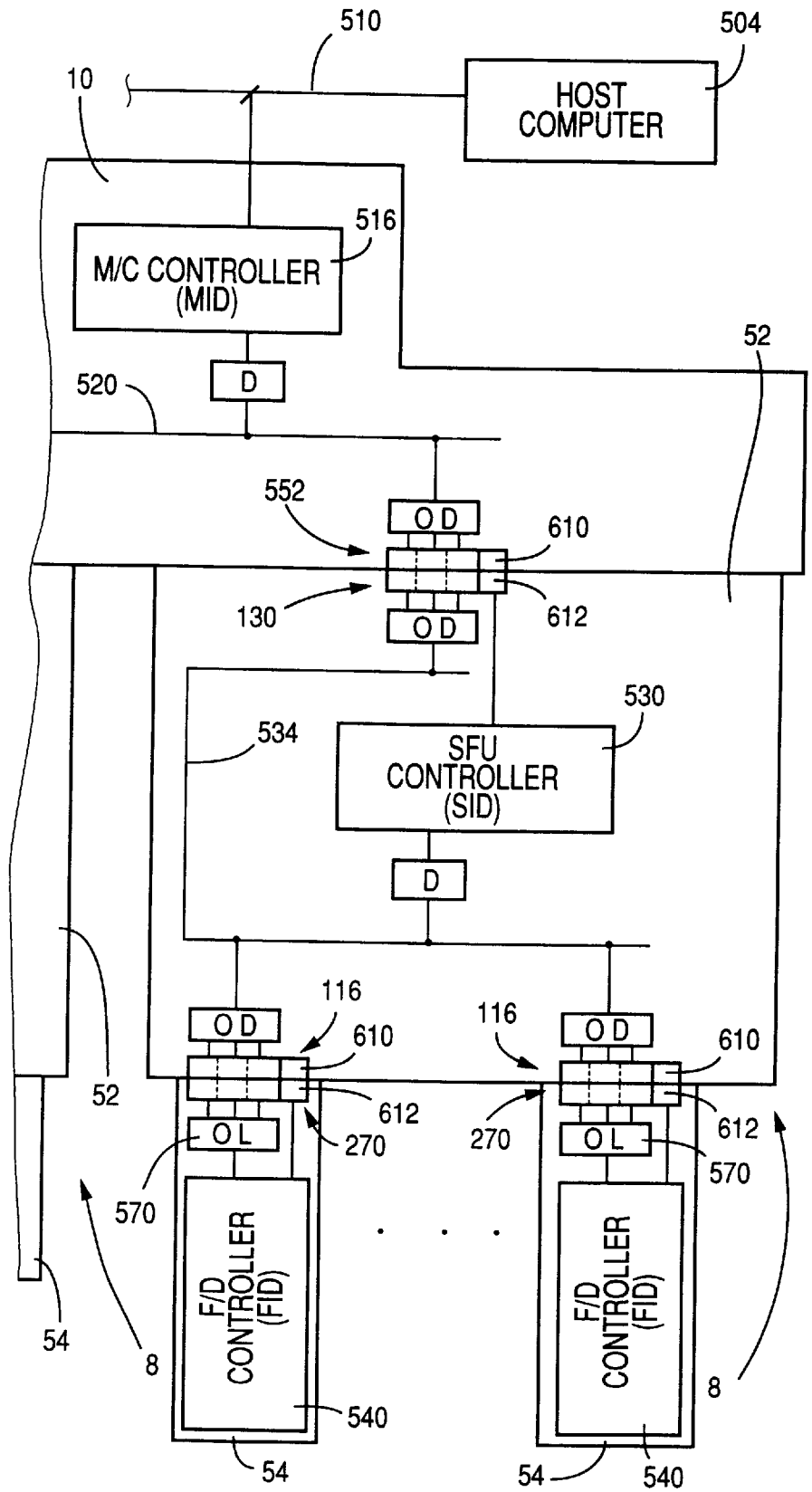
FIG. 21 is a diagrammatic view of a CC mounting system as a third embodiment of the present invention.

FIG. 21 shows a third embodiment of the present invention which also relates to a CC mounting system including a CC mounting apparatus 10 and two support cars 52. In FIG. 21, reference numeral 610 designates an own Maxi or Calla code of each of the two combining devices of the CC mounting apparatus 10. In a state in which each support car 52 is combined with one of the two combining devices of the apparatus 10, the code is read by a Maxi- or Calla-code reader 612 as a code identifying device which is provided on that car 52. The reader 612 is connected to the SFU controller 530 of the car 52. Thus, the SFU controller 530 of each of the two cars 52 can identify with which one of the two combining devices that car 52 has been combined, that is, the position where that car 52 is combined with the apparatus 10.

Additionally, each of the twenty-four FHUs 100 of each car 52 is equipped with its own Maxi or Calla code 610, which is read by a code reader 612 which is provided on each feeder 54. Thus, the F/D controller 540 of each of the twenty-four feeders 54 can identify by which one of the twenty-four FHUs 100 that feeder 54 has been held, that is, the position where that feeder 54 is held on one car 52.

In the third embodiment, each one of the two SFU controllers 530 can identify its own position relative to the other SFU controller 530, and each one of the F/D controllers 540 can identify its own position relative to the other F/D controllers 540. Each controller 530, 540 informs the M/C controller 516 of its own position. Thus, the M/C controller 516 can identify the position of each of the feeders 54 held on the car or cars 52. The codes 610 may be replaced by other sorts of identification things, such as bar codes or identification (ID) chips. The code reader 602 and the S/F controller 540 of each feeder 54 provide a non-contact-type identifying device which identifies each identification code 610 without mechanically contacting the same 610.

Figure 22:
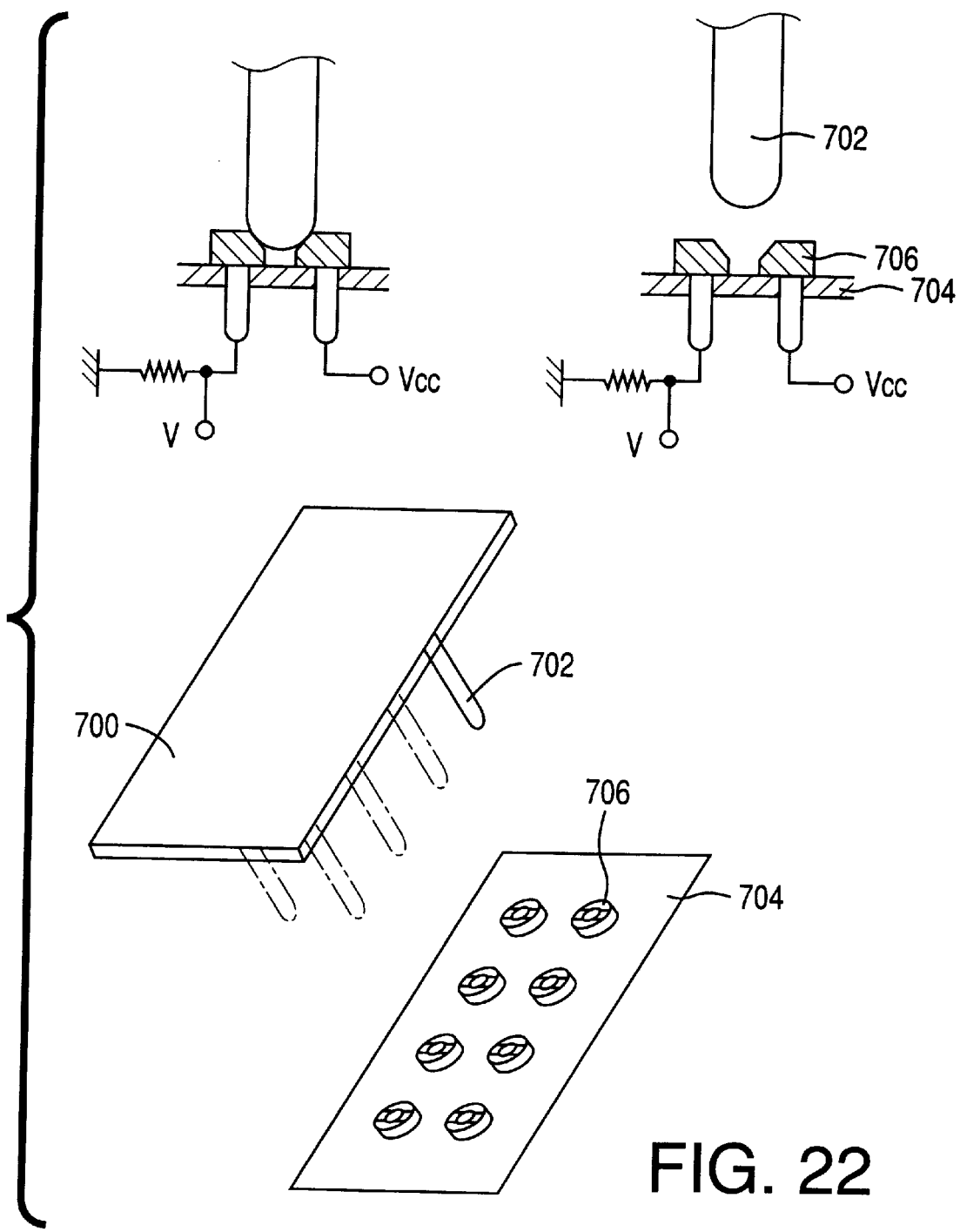
FIG. 22 is a view of a first and a second connector which may be employed in place of each Calla code 610 and each Calla-code reader 612 employed in the CC mounting system of FIG. 21.

FIG. 22 shows an identification thing in the form of a first connector 700 which may be employed in place of each Maxi or Calla code 610 in the third embodiment shown in FIG. 21. Each first connector 700 has from zero to eight electrically conductive projections 702 corresponding to eight-bit information. In this case, each code reader 612 shown in FIG. 21 is replaced by each second connector 704 having eight electrical switches 706 corresponding to at most the eight projections 702 of each first connector 700. When each car 52 is combined with one of the two combining devices of the CC mounting apparatus 10, the second connector 704 of each car 52 is connected to the first connector 700 of that one combining device. Based on the ON or OFF state of each of the eight switches 706 of the second connector 704, the SFU controller 530 of each car 52 can identify one of the two combining devices with which that car 52 is currently combined with the CC mounting apparatus 10. Likewise, when each feeder 54 is set on one of the FHUs 100 of one car 52, the second connector 704 of each feeder 54 is connected to the first connector 700 of that one FHU 100, and the F/D controller 540 of each feeder 54 can identify one of the twenty-four FHUs 100 which currently holds that feeder 54. The second connector 704 and the F/D controller 530 of each feeder 54 provide a contact-type identifying device which identifies each first connector 700 by mechanically contacting the same 700.

In each of the illustrated embodiments, the CC mounting system is equipped with the single CC mounting apparatus 10 and the two support cars 52. However, the CC mounting system may employ any number of apparatus 10, any number of cars 52, or any number of feeders 54 mounted on each car 52.

While the present invention has been described in its preferred embodiments, it is to be understood that the present invention may be embodied with other changes, improvements, and modifications that may occur to those skilled in the art without departing from the spirit and scope of the invention.

What is claimed is:

1. A circuit component supplying system comprising:

a plurality of feeders each of which stores a plurality of circuit components of at least one sort, moves the circuit components of said one sort, one by one, to a predetermined position thereon, and supplies the circuit components one by one from the predetermined position;

at least one feeder holder including a plurality of feeder holding portions which hold the plurality of feeders, respectively;

a managing device which manages the supplying of the circuit components by said each of the feeders from the predetermined position thereof;

said each feeder including a code holder which holds at least a feeder identification code distinguishing said each feeder from the other feeders; and said managing device managing the supplying of the circuit components by said each feeder, based on the feeder identification code held by the code holder of said each feeder.

2. A circuit component supplying system according to claim 1, wherein said each feeder comprises a feeder-side controller, and wherein the managing device comprises a holder-side controller provided on the side of the feeder holder; a first communication network with which the respective feeder-side controllers of the feeders which are held by the feeder holding portions, respectively, are parallel connected to the holder-side controller; a second communication network with which each of the respective feeder-side controllers is connected to the holder-side controller, independent of the other feeder-side controllers; and an identification-control device which causes one of said each feeder-side controller and the holder-side controller to send, to the first communication network, a first signal including the feeder identification code of the feeder having said each feeder-side controller, causes one of said each feeder-side controller and the holder-side controller to send a second signal to the second communication network, so that the other controller receives the second signal, and identifies one of the feeder holding portions which holds the feeder having said each feeder-side controller, from the other feeder holding portions.

3. A circuit component supplying system according to claim 2, wherein the managing device further comprises a component-feeder memory which stores information including the respective feeder identification codes of the feeders and respective component identification codes corresponding to a plurality of sorts of circuit components, respectively, such that the feeder identification code of said each feeder is related to the component identification code corresponding to said one sort of the circuit components stored in said each feeder; and component-sort identifying means for identifying the sort of the circuit components corresponding to said one feeder holding portion identified by the identification-control device, based on the information stored in the component-feeder memory and the feeder identification code of the feeder held by said one feeder holding portion.

4. A circuit component supplying system according to claim 2, wherein the identification-control device comprises feeder-identification-code sending means provided in the feeder-side controller of said each feeder, for sending, as the first signal, the feeder identification code of said each feeder, to the first communication network; response causing means provided in the holder-side controller, for causing sending, to the first communication network, a response command including the feeder identification code sent from the feeder-identification-code sending means, the response command causing the feeder-side controller of said each feeder corresponding to the feeder identification code included in the response command, to send, as the second signal, a response signal to the second communication network; responding means provided in the feeder-side controller of said each feeder, for sending the response signal to the second communication network, in response to the response command; and feeder-holding-portion identifying means provided in the holder-side controller, for identifying, based on the response signal, said one of the feeder holding portions which holds said each feeder corresponding to the feeder identification code included in the response command.

5. A circuit component supplying system according to claim 4, further comprising an electric-power supplying device which is provided on the side of the feeder holder and which supplies an electric power to said each feeder which is held by the feeder holder, and wherein the feeder-identification-code sending means of said each feeder sends the feeder identification code of said each feeder to the first communication network, in response to commencement of the supplying of the electric power from the electric-power supplying device to said each feeder.

6. A circuit component supplying system according to claim 2, wherein the identification-control device comprises response causing means provided in the holder-side controller, for causing sequentially sending, to the first communication network, a plurality of response commands as the first signals which include the feeder identification codes of the feeders, respectively, which may possibly be held by the feeder holder, each of the response commands causing the feeder-side controller of the feeder corresponding to the feeder identification code included in said each response command, to send, as the second signal, a response signal to the second communication network; responding means provided in the feeder-side controller of said each feeder, for sending the response signal to the second communication network, in response to said each response command, when the feeder identification code included in said each response command is identical with the feeder identification code of said each feeder; and feeder-holding-portion identifying means provided in the holder-side controller, for identifying, based on the response signal, said one of the feeder holding portions which holds the feeder corresponding to the feeder identification code included in said each response command.

7. A circuit component supplying system comprising:

a plurality of feeders each of which stores a plurality of circuit components of at least one sort and supplies the circuit components of said one sort, one by one, said each feeder including a feeder-side connection portion;

said each feeder further including a feeder-side controller which is connected to the feeder-side connection portion;

a feeder holder including a plurality of feeder holding portions which hold the plurality of feeders, respectively;

a communication network including a plurality of holder-side connection portions which are provided on the side of the feeder holder and which correspond to the feeder-side connection portions of the feeders, respectively, and are parallel connected to a remaining portion of the communication network, the communication network communicating a first signal with the feeder-side controller of said each feeder via the feeder-side connection portion of said each feeder and a corresponding one of the holder-side connection portions, without identifying said one holder-side connection portion from the other holder-side connection portions;

a feeder-holding-portion identifying device which identifies one of the feeder holding portions which holds said each feeder, from the other feeder holding portions; and a holder-side controller which is provided on the side of the feeder holder and is connected to the communication network.

8. A circuit component supplying system according to claim 7, wherein the feeder-holding-portion identifying device comprises a plurality of second feeder-side connection portions each of which is provided on a corresponding one of the feeders, as being different from the feeder-side connection portion of said one feeder as a first feeder-side connection portion thereof, and is connected to the feeder-side controller of said one feeder; a plurality of second holder-side connection portions which correspond to the second feeder-side connection portions of the feeders, respectively, and each of which is provided on a corresponding one of the feeder holding portions, as being different from the holder-side connection portion of said one feeder holding portion as a first holder-side connection portion thereof, and is connected to the holder-side controller, independent of the other second holder-side connection portions; and an identification-control device which causes one of the second feeder-side connection portion of said each feeder and a corresponding one of the second holder-side connection portions, to send a second signal to the other connection portion, causes said other connection portion to receive the second signal, and identifies said one feeder holding portion holding said each feeder.

9. A circuit component supplying system according to claim 7, wherein the feeder-holding-portion identifying device comprises a feeder-identification-code memory which is provided on said each feeder and which stores a feeder identification code corresponding to said each feeder in a state in which the feeder identification code is readable therefrom; a feeder-holding-portion identification-code memory which corresponds to each of the feeder holding portions and which stores a feeder-holding-portion identification code corresponding to said each feeder holding portion in a state in which the feeder-holding-portion identification code is readable therefrom; and identification-code relating means provided on one of said each feeder and the feeder holder, for reading the feeder identification code of said each feeder and the feeder-holding-portion identification code of said each feeder holding portion and relating the two identification codes to each other.

10. A circuit component supplying system according to claim 7, wherein the feeder-holding-portion identifying device comprises a plurality of identification things each of which distinguishes a corresponding one of the feeder holding portions from the other feeder holding portions; and an identification-thing identifying device which is provided on said each feeder and which identifies the identification thing of said one feeder holding portion from the respective identification things of said other feeder holding portions.

11. A circuit component supplying system according to claim 10, wherein the identification-thing identifying device comprises a no-contact-type identifying device which identifies the identification thing of said each feeder holding portion without mechanically contacting the identification thing.

12. A circuit component supplying system according to claim 10, wherein the identification-thing identifying device comprises a contact-type identifying device which identifies the identification thing of said each feeder holding portion by mechanically contacting the identification thing.

13. A feeder for storing a plurality of circuit components of at least one sort, moving the circuit components of said one sort, one by one, to a predetermined position thereon, and supplying the circuit components one by one from the predetermined position, the improvements comprising an identification code memory which stores a feeder identification code distinguishing the feeder from other feeders, in a state in which the feeder identification code is readable therefrom.

14. A feeder according to claim 13, further comprising identification-code reading means for reading the feeder identification code from the identification code memory.

15. A feeder according to claim 13, further comprising a feeder-side connection portion which is connectable to one of respective holder-side connection portions of a plurality of feeder holding portions of a feeder holder, such that the feeder-side connection portion can transmit a signal to said one holder-side connection portion.

16. A feeder according to claim 15, further comprising an identification-code transmitter which transmits the feeder identification code read by the identification-code reading means to said one holder-side connection portion via the feeder-side connection portion.

17. A method of managing the supplying of circuit components by a circuit component supplying system including a plurality of feeders each of which stores a plurality of circuit components of at least one sort, moves the circuit components of said one sort, one by one, to a predetermined position thereon, and supplies the circuit components one by one from the predetermined position, the method comprising the steps of:

assigning a plurality of feeder identification codes to the feeders, respectively, and managing the supplying of the circuit components by the feeders of the circuit component supplying system from the respective predetermined positions of the feeders, based on the respective feeder identification codes of the feeders.

18. A method according to claim 17, further comprising the steps of:

relating the feeder identification code of each of the feeders to a component identification code corresponding to said one sort of the circuit components stored in said each feeder, relating the feeder identification code of said each feeder to one of a plurality of feeder holding portions of a feeder holder of the circuit component supplying system which hold the feeders, respectively, said one feeder holding portion holding said each feeder, and identifying the sort of the circuit components corresponding to said one feeder holding portion.

19. A circuit component mounting system comprising:

a circuit component supplying system comprising
  a plurality of feeders each of which stores a plurality of circuit components of at least one sort and supplies the circuit components of said one sort, one by one,
  a plurality of feeder holders including respective feeder holding portions which hold the plurality of feeders, respectively,
  a managing device which manages the supplying of the circuit components by said each of the feeders,
  said each feeder including a code holder which holds at least a feeder identification code distinguishing said each feeder from the other feeders, and
  said managing device managing the supplying of the circuit components by said each feeder, based on the feeder identification code held by the code holder of said each feeder;

a circuit component mounting apparatus which mounts, on a circuit substrate, the circuit components supplied from the supplying system;

the mounting apparatus comprising a plurality of combining positions where the plurality of feeder holders are combinable with the mounting apparatus, respectively; and the managing device of the supplying system comprising
  a mounting-apparatus-side controller which is provided on the side of the mounting apparatus,
  a plurality of holder-side controllers each of which is provided on a corresponding one of the feeder holders which are combined at the respective combining positions with the mounting apparatus,
  a first communication network with which the holder-side controllers are parallel connected to the mounting-apparatus-side controller,
  a second communication network with which each of the holder-side controllers is connected to the mounting-apparatus-side controller, independent of the other holder-side controllers, and
  an identification-control device which causes one of said each holder-side controller and the mounting-apparatus-side controller to send, to the first communication network, a first signal including a holder identification code corresponding to the feeder holder having said each holder-side controller, causes one of said each holder-side controller and the mounting-apparatus-side controller to send a second signal to the second communication network, so that the other controller receives the second signal, and identifies one of the combining positions where the feeder holder having said each holder-side controller is combined with the mounting apparatus.

20. A circuit component mounting system according to claim 19, wherein the identification-control device comprises holder-identification-code sending means provided in the holder-side controller of each of the feeder holders, for sending, as the first signal, the holder identification code of said each feeder holder, to the first communication network; response causing means provided in the mounting-apparatus-side controller, for causing sending, to the first communication network, a response command including the holder identification code sent from the holder-identification-code sending means, the response command causing the holder-side controller of said each feeder holder corresponding to the holder identification code included in the response command, to send a response signal to the second communication network; responding means provided in the holder-side controller of said each feeder holder, for sending the response signal to the second communication network, in response to the response command; and feeder-holding-portion identifying means provided in the mounting-apparatus-side controller, for identifying, based on the response signal, one of the combining positions where said each feeder holder corresponding to the holder identification code included in the response command is combined with the mounting apparatus.

21. A circuit component mounting system according to claim 20, further comprising an electric-power supplying device which is provided on the side of the mounting apparatus and which supplies an electric power to said each feeder holder which is combined with the mounting apparatus, and wherein the holder-identification-code outputting means sends the holder identification code of said each feeder holder to the first communication network, in response to commencement of the supplying of the electric power from the electric-power supplying device to said each feeder holder.

22. A circuit component mounting system according to claim 19, wherein the identification-control device comprises response causing means provided in the mounting-apparatus-side controller, for causing sequentially sending, to the first communication network, a plurality of response commands as the first signals which include the holder identification codes of the feeder holders, respectively, which may possibly be combined with the mounting apparatus, each of the response commands causing the holder-side controller of the feeder holder corresponding to the holder identification code included in said each response command, to send a response signal to the second communication network; responding means provided in the holder-side controller of each of the feeder holders, for sending, as the second signal, the response signal to the second communication network, in response to said each response command, when the holder identification code included in said each response command is identical with the holder identification code of said each feeder holder; and combining-position identifying means provided in the mounting-apparatus-side controller, for identifying, based on the response signal, said one of the combining positions where the feeder holder corresponding to the holder identification code included in said each response command is combined with the mounting apparatus.

* * * * *